(12) United States Patent
Smith

(10) Patent No.: US 11,876,537 B2
(45) Date of Patent: Jan. 16, 2024

(54) SYSTEM AND METHOD FOR RECEPTION OF WIRELESS LOCAL AREA NETWORK PACKETS WITH BIT ERRORS

(71) Applicant: SR Technologies, Inc., Sunrise, FL (US)

(72) Inventor: Graham K. Smith, Boca Raton, FL (US)

(73) Assignee: SR Technologies, Inc., Sunrise, FL (US)

( * ) Notice: Subject to any disclaimer, the term of this patent is extended or adjusted under 35 U.S.C. 154(b) by 0 days.

(21) Appl. No.: 18/150,944

(22) Filed: Jan. 6, 2023

(65) Prior Publication Data

US 2023/0155729 A1  May 18, 2023

Related U.S. Application Data

(63) Continuation of application No. 17/492,842, filed on Oct. 4, 2021, now Pat. No. 11,581,907.

(60) Provisional application No. 63/127,276, filed on Dec. 18, 2020.

(51) Int. Cl.
| | |
|---|---|
| *H04W 28/04* | (2009.01) |
| *H03M 13/43* | (2006.01) |
| *H04L 5/00* | (2006.01) |
| *H04L 1/00* | (2006.01) |
| *H03M 13/09* | (2006.01) |

(52) U.S. Cl.
CPC ......... *H03M 13/43* (2013.01); *H03M 13/096* (2013.01); *H04L 1/0061* (2013.01); *H04L 5/0053* (2013.01); *H04W 28/04* (2013.01)

(58) Field of Classification Search
CPC .... H03M 13/096; H03M 13/09; H03M 13/43; H03M 13/6306; H04L 5/0053; H04L 1/08; H04L 1/0045; H04L 1/0061; H04W 28/04

See application file for complete search history.

(56) References Cited

U.S. PATENT DOCUMENTS

| | | |
|---|---|---|
| 2004/0165656 A1 | 8/2004 | Shiue et al. |
| 2006/0141935 A1 | 6/2006 | Hou et al. |
| 2007/0040704 A1 | 2/2007 | Smee et al. |
| 2015/0334703 A1 | 11/2015 | Xu et al. |
| 2017/0012887 A1* | 1/2017 | Ohta ............... H04L 43/08 |
| 2017/0079006 A1* | 3/2017 | Li ............... H04L 5/0048 |
| 2017/0331670 A1 | 11/2017 | Parkvall et al. |

(Continued)

*Primary Examiner* — Syed Ali

(74) *Attorney, Agent, or Firm* — Christopher & Weisberg, P.A.

(57) ABSTRACT

A method in a first wireless device (WD) supporting wireless communication with a second WD is described. A plurality of wireless packets is received from the second WD including at least a first wireless packet. At least another wireless packet of the plurality of wireless packets is one of a retry packet and a repeat packet of the first packet. Each wireless packet of the plurality of wireless packets includes a plurality of bits and a first group of bits. For each received wireless packet, the plurality of bits corresponding to the received wireless packet is de-spread, and the first group of bits is correlated with a predetermined group of bits. The method further includes performing a majority vote based on the correlation of the first group of bits of each received wireless packet and creating a corrected packet based in part on the majority vote.

18 Claims, 13 Drawing Sheets

(56) References Cited

U.S. PATENT DOCUMENTS

| | | | |
|---|---|---|---|
| 2017/0366997 A1* | 12/2017 | Kim | H04B 7/06 |
| 2018/0027436 A1* | 1/2018 | Iyer | H04L 1/203 |
| | | | 370/242 |
| 2019/0268092 A1* | 8/2019 | Byun | H04L 1/0057 |
| 2021/0204326 A1* | 7/2021 | Zhang | H04W 72/23 |
| 2021/0235412 A1* | 7/2021 | Chen | H04L 1/0061 |
| 2021/0314955 A1* | 10/2021 | Zhang | H04L 5/0053 |
| 2022/0014314 A1* | 1/2022 | Wang | H04W 72/1268 |
| 2022/0038244 A1* | 2/2022 | Zhang | H04L 1/08 |
| 2022/0053525 A1* | 2/2022 | Lee | H04B 7/0645 |
| 2022/0174685 A1* | 6/2022 | Lee | H04W 72/542 |

* cited by examiner

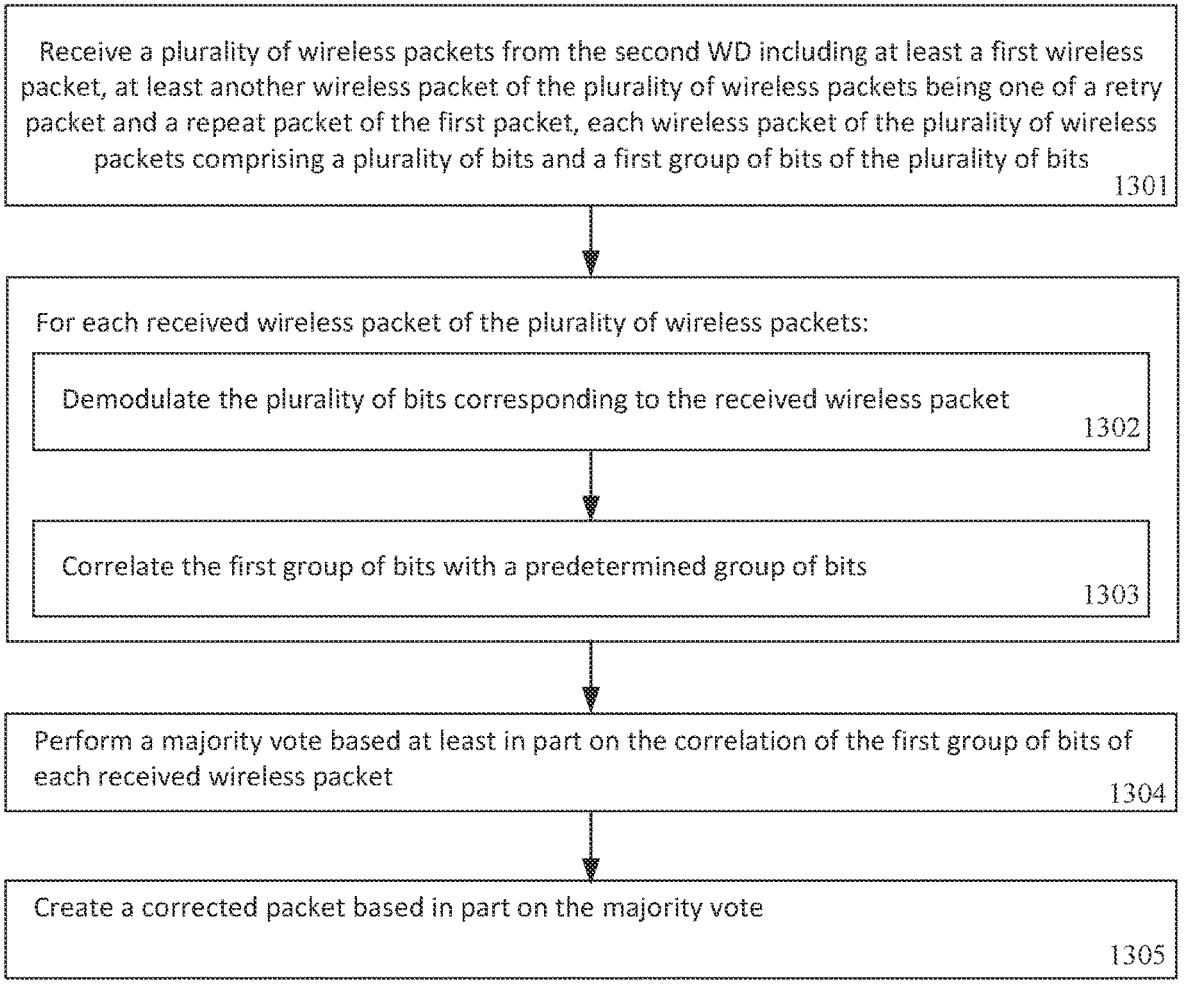

US 11,876,537 B2

SYSTEM AND METHOD FOR RECEPTION OF WIRELESS LOCAL AREA NETWORK PACKETS WITH BIT ERRORS

CROSS-REFERENCE TO RELATED APPLICATION

This application is a continuation of U.S. patent application Ser. No. 17/492,842, filed Oct. 4, 2021, which is related to and claims priority to U.S. Provisional Patent Application Ser. No. 63/127,276, filed Dec. 18, 2020, entitled "SYSTEM AND METHOD FOR RECEPTION OF WIRELESS LOCAL AREA NETWORK PACKETS WITH BIT ERRORS," the entirety of both of which are incorporated herein by reference.

TECHNICAL FIELD

The present disclosure relates to wireless communications, and in particular to a monitoring station and method for the reception of packets with bit errors from a target wireless device.

BACKGROUND

The present disclosure relates to communication between devices, where the communication is based upon IEEE 802.11 technology commonly known as Wi-Fi. IEEE Standard 802.11-2016 is used as a reference for some specifications used in the present disclosure. Standard exchange of packets between two stations (STAs), such as between a STA A and STA B, involves the STA A transmitting a packet to STA B and then waiting for an acknowledgment (ACK) packet to be received back from STA B before sending the next packet. In a standard infrastructure network, either STA A or STA B may be an access point (AP). Consider a case where STA A is an AP and STA B is a station, STA. After the AP has transmitted the packet to a STA, the AP will wait for a set timeout period. If the ACK is not received within that timeout period, the AP will assume that the packet failed and will, in most cases, retry the transmission. If, at the STA, the packet is received with errors, then the STA will not transmit an ACK. In the case that successive transmissions of that packet do not receive an ACK within the specified timeout period, then the AP will retry the packet up to a retry limit and, at that point, discard the packet.

FIG. 1 is a block diagram depicting a monitoring station 100 receiving a communication packet from a target station 110, e.g., a legacy Wi-Fi station such as a known Wi-Fi station. The monitoring station 100 and the target station 110, e.g., the legacy Wi-Fi station, are at a distance d 150 apart. As the distance d 150 increases, the received signal level and the signal-to-noise ratio, SNR, at the monitoring station 100 lowers, and the point may be reached where the received signal level at the monitoring station 100 is such that the communication packet is received with bit errors and, as discussed above, the packet fails. Any obstruction losses between the target station 110, e.g., the legacy Wi-Fi station, and the monitoring station 100 may also contribute to low SNR.

FIG. 2 is a diagram showing a format of a direct sequence spread spectrum, DSSS, packet 200, e.g., a data or management packet, that complies with the Standard. The direct sequence spread spectrum, DSSS, system is described in Clause 15 of the Standard. Each bit is spread with an 11-bit Barker code spreading sequence. A packet comprises a physical layer, PHY, preamble 210, a PHY header 220 and medium access control, MAC, protocol data unit, MPDU, 230. The PHY preamble 210 comprises two subfields, SYNC 211, and start of frame delimiter SFD 212. The PHY header 220 comprises four subfields: Signal 221, Service 222, Length 223, and cyclic redundancy check CRC 224. The MPDU 230 is comprised of the following fields/subfields: Frame Control 231, Duration 232, Address 1 233, Address 2 234, Address 3 235, and Sequence Control 236, which together comprise the MAC Header 239, plus the Frame Body 237, and frame check sum FCS 238.

All the bits in the packet 200, e.g., DSSS packet, are scrambled with a polynomial $G(z)=Z^{-7}+Z^{-4}+1$ before being transmitted. Hence, the raw received bits, after de-spreading, are the scrambled bits which are then de-scrambled in order to reproduce the original bit stream. Any raw bits that are received in error, when de-scrambled, result in 3 out of the next 8 de-scrambled bits also being in error. The CRC 224 is used to protect the contents of the Signal 221, Service 222 and Length 223 fields/subfields. The FCS 238 is a 32-bit field containing a 32-bit CRC. The FCS is calculated over all of the other fields of the MPDU 230. Therefore, in order for a DSSS packet to be successfully received, there must not be any error in any of the raw received bits. If either the CRC or FCS checks are not correct, then the packet is deemed to have failed and no ACK packet is sent in response. The expected behavior is that the packet will then be retransmitted as a "retry" with the Retry bit 241 in the Frame Control 231 set to 1. The Type 242 and Subtype 243 fields in the Frame Control 231, define the type of packet, e.g., data, or management (e.g., probe request or response, association request or response).

A packet may be re-tried up to a "retry limit" which is set by the station transmitting the packet. As the SNR of the received packet decreases, the possibility of a bit being received in error increases. For example, as the range increases, in the general sense, the SNR will decrease, and there exists a limitation to the range at which a packet may be received without bit errors.

SUMMARY

The present disclosure advantageously provides a method, an apparatus and a measuring station for receiving wireless packets with bit errors and/or creating at least a corrected packet based in part on a majority vote.

In one aspect of the disclosure, a method in a first wireless device (WD) supporting wireless communication with a second WD is described. The method comprising receiving a plurality of wireless packets from the second WD including at least a first wireless packet. At least another wireless packet of the plurality of wireless packets is one of a retry packet and a repeat packet of the first packet. Each wireless packet of the plurality of wireless packets comprises a plurality of bits and a first group of bits of the plurality of bits. For each received wireless packet of the plurality of wireless packets, the plurality of bits corresponding to the received wireless packet is de-spread, and the first group of bits is correlated with a predetermined group of bits. The method further includes performing a majority vote based at least in part on the correlation of the first group of bits of each received wireless packet and creating a corrected packet based in part on the majority vote.

In some embodiments, the method further includes, for each received wireless packet of the plurality of wireless packets, storing the de-spread plurality of bits in a first location; de-scrambling the de-spread plurality of bits; storing the de-spread de-scrambled plurality of bits in a second location; determining whether the correlation of the first group of bits in the first location exceeds a predetermined threshold; and storing the received de-spread plurality of bits in the first location in a third location if the correlation of the first group of bits exceeds the predetermined threshold. The majority vote is performed on the plurality of bits of each received wireless packet stored in the third location.

In some other embodiments, each wireless packet of the plurality of wireless packets is a direct sequence spread spectrum (DSSS) packet. Each wireless packet further includes a second group of bits and comprises a plurality of fields. Each field of the plurality of fields includes at least one bit of the plurality of bits. The plurality of fields includes a physical layer (PHY) preamble field, a PHY header field, and medium access control (MAC) header field, a sequence control field, a frame body field, and a frame check sum (FCS) field. The first group of bits including bits of the de-spread plurality of bits that are part of at least one of the PHY preamble field, the PHY header field, and the MAC header field, the second group of bits including bits of the de-spread plurality of bits that are part of at least one of the sequence control field, the frame body field, and the FCS field.

In an embodiment, the plurality of fields further includes a cyclic redundancy check (CRC) field, a length field that is part of the PHY header field, a signal field, and a service field. The method further includes, for each received wireless packet: performing a CRC check of bits, the CRC check of bits including determining whether a CRC value of PHY header field bits that stored in the first location is correct; if the CRC value is correct, determining a value of the length field; if the CRC value is incorrect and a value of at least one of the signal field and the service field is incorrect: correcting the value of at least one of the signal field and the service field; performing the CRC check of bits; and if the CRC value is correct, determining the value of the length field.

In another embodiment, the plurality of fields further includes a cyclic redundancy check (CRC) field and a length field that is part of the PHY header field. Further, the method includes, for each received wireless packet: determining a number of de-spread bits stored in the first location; determining a value of the length field based upon the determined number of de-spread bits; and determining a CRC value using the determined value of the length field.

In some embodiments, the first group of bits are scrambled bits that are error free. The first group of bits has a first total number of bits, the predetermined group of bits has bits of the de-spread plurality of bits, and the predetermined group of bits has a second total number of bits. The first total number of bits and the second total number of bits being equal.

In some other embodiments, the first total number of bits is determined based in part on one value of at least one field of the plurality of fields and an estimated value of at least another field of the plurality of fields.

In an embodiment, the majority vote is performed if there is an odd number, greater than 1, of received wireless packets. Creating the corrected packet includes: assembling a new plurality of scrambled bits based on the majority vote; de-scrambling the new plurality of scrambled bits; and creating the corrected packet further from the de-scrambled new plurality of scrambled bits.

In another embodiment, the method further includes determining the corrected packet is error free by performing a frame check sum (FCS); and transmitting an acknowledgement (ACK) signal to the second WD.

In some embodiments, the plurality of fields further includes a duration field, a retry field, a type field, and a subtype field. Further, the method includes: setting a value of the duration field to a predetermined duration field value; setting a value of the retry field to 0 for a first received wireless packet and the value of the retry field to 1 for a second received wireless packet; and setting each of a value of the type field to a predetermined type field value and a value of the subtype field to a predetermined subtype field value.

In another aspect, a first wireless device (WD) supporting wireless communication with a second WD is described. The first WD comprises a transmitter receiver configured to receive a plurality of wireless packets from the second WD including at least a first wireless packet. At least another wireless packet of the plurality of wireless packets is one of a retry packet and a repeat packet of the first packet. Each wireless packet of the plurality of wireless packets comprises a plurality of bits and a first group of bits of the plurality of bits. The first WD further comprise processing circuitry in communication with the transmitter receiver. The processing circuitry is configured to, for each received wireless packet of the plurality of wireless packets de-spread the plurality of bits corresponding to the received wireless packet and correlate the first group of bits with a predetermined group of bits. Further, the processing circuitry is configured to perform a majority vote based at least in part on the correlation of the first group of bits of each received wireless packet and create a corrected packet based in part on the majority vote.

In some embodiments, the processing circuitry is further configured to, for each received wireless packet of the plurality of wireless packets: store the de-spread plurality of bits in a first location; de-scramble the de-spread plurality of bits; store the de-spread de-scrambled plurality of bits in a second location; determine whether the correlation of the first group of bits in the first location exceeds a predetermined threshold; and store the received de-spread plurality of bits in the first location in a third location if the correlation of the first group of bits exceeds the predetermined threshold. The majority vote being performed on the plurality of bits of each received wireless packet stored in the third location.

In some other embodiments, each wireless packet of the plurality of wireless packets is a direct sequence spread spectrum (DSSS) packet. Each wireless packet further includes a second group of bits comprising a plurality of fields. Each field of the plurality of fields includes at least one bit of the plurality of bits. The plurality of fields includes a physical layer (PHY) preamble field, a PHY header field, and medium access control (MAC) header field, a sequence control field, a frame body field, and a frame check sum (FCS) field. The first group of bits includes bits of the de-spread plurality of bits that are part of at least one of the PHY preamble field, the PHY header field, and the MAC header field. The second group of bits including bits of the de-spread plurality of bits that are part of at least one of the sequence control field, the frame body field, and the FCS field.

In an embodiment, the plurality of fields further includes a cyclic redundancy check (CRC) field, a length field that is part of the PHY header field, a signal field, and a service field. The processing circuitry is further configured to, for each received wireless packet: perform a CRC check of bits, the CRC check of bits including determining whether a CRC value of PHY header field bits that stored in the first location is correct; if the CRC value is correct, determine a value of the length field; if the CRC value is incorrect and a value of at least one of the signal field and the service field is incorrect: correct the value of at least one of the signal field and the service field; perform the CRC check of bits; and if the CRC value is correct, determine the value of the length field.

In another embodiment, the plurality of fields further includes a cyclic redundancy check (CRC) field and a length field that is part of the PHY header field. The processing circuitry is further configured to, for each received wireless packet: determine a number of de-spread bits stored in the first location; determine a value of the length field based upon the determined number of de-spread bits; and determine a CRC value using the determined value of the length field.

In some embodiments, the first group of bits are scrambled bits that are error free. The first group of bits has a first total number of bits. The predetermined group of bits includes bits of the de-spread plurality of bits and has a second total number of bits. The first total number of bits and the second total number of bits are equal. The first total number of bits are determined based in part on one value of at least one field of the plurality of fields and an estimated value of at least another field of the plurality of fields.

In some other embodiments, the majority vote is performed if there is an odd number, greater than 1, of received wireless packets. Creating the corrected packet includes: assembling a new plurality of scrambled bits based on the majority vote; de-scrambling the new plurality of scrambled bits; and creating the corrected packet further from the de-scrambled new plurality of scrambled bits.

In an embodiment, the processing circuitry is further configured to determine the corrected packet is error free by performing a frame check sum (FCS) and transmit an acknowledgement (ACK) signal to the second WD.

In another embodiment, the plurality of fields further includes a duration field, a retry field, a type field, and a subtype field. The processing circuitry is further configured to: set a value of the duration field to a predetermined duration field value; set a value of the retry field to Θ for a first received wireless packet and the value of the retry field to 1 for a second received wireless packet; set each of a value of the type field to a predetermined type field value and a value of the subtype field to a predetermined subtype field value.

In yet another aspect, a measuring station comprising a first wireless device (WD) supporting wireless communication with a second WD is described. The first WD includes a transmitter receiver configured to receive a plurality of wireless packets from the second WD including at least a first wireless packet. At least another wireless packet of the plurality of wireless packets is one of a retry packet and a repeat packet of the first packet. Each wireless packet of the plurality of wireless packets includes a plurality of bits and a first group of bits of the plurality of bits. The first WD further includes processing circuitry in communication with the transmitter receiver. The processing circuitry is configured to, for each received wireless packet of the plurality of wireless packets: de-spread the plurality of bits corresponding to the received wireless packet; correlate the first group of bits with a predetermined group of bits; and determine whether the correlation of the first group of bits exceeds a predetermined threshold. The processing circuitry is further configured to perform a majority vote on the plurality of bits of each received wireless packet for which the correlation of the first group of bits exceeds the predetermined threshold and create a corrected packet based in part on the majority vote.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein:

FIG. 13 is a flowchart of an exemplary process that creates at least a corrected wireless packet, received with bit errors, based in part on the majority vote, e.g., utilizing the wireless communications device, which according to an embodiment of the disclosure may be used as or as part of the monitoring station.

DETAILED DESCRIPTION

This disclosure provides methods and devices for the correction of data or management packets received with bit errors for devices that are based upon the IEEE 802.11 technology, commonly known as Wi-Fi. In some embodiments, this disclosure provides solutions for cases where a monitoring station 100 receives a series of a packet plus retries, each with bit errors, from a target station 110, e.g., a legacy Wi-Fi station. The target station 110, e.g., the legacy Wi-Fi station is one that complies with the 802.11 Standard, generally known as Wi-Fi. The monitoring station 100 is one that generally complies with the 802.11 Standard but has been modified, as described in this disclosure, to receive and correct a series of a packet plus retries, each with bit errors, from a target station 110, e.g., a legacy Wi-Fi station. Although the embodiments disclosed herein relate to Wi-Fi communications, the disclosure is not limited to Wi-Fi communications, and may be applied to other types of communications between wireless devices.

Methods to overcome and correct the reception of a series of a received packet plus retries, each with bit errors, are described herein. Also, methods are disclosed that enable the monitoring station 100 to receive packets from a target station 110, e.g., a legacy Wi-Fi station, at extended ranges or at lower SNRs than would be the norm. The packets from the target station 110, e.g., the legacy Wi-Fi station, may be referred to as "wanted" packets". The target station 110, e.g., t legacy Wi-Fi station, may be a device such as a station (STA) or an access point (AP). In the above and following description, the legacy Wi-Fi station is referred to as the "target station 110", and is generally described as an AP as this aids in the descriptive process. However, the disclosure is not limited solely to such an arrangement.

This disclosure uses the processes of "auto-correlation" and "majority voting". When receiving re-tried packets with errors, auto correlation may be used on the part of the packet(s) that is known a priori, such that it may be confirmed that the received packet is indeed the wanted packet, whereas majority voting may be used on the individual bits of the repeated, re-tried, parts of the packet in order to attempt to recover the correct bits. A more complete understanding of the present invention, and the attendant advantages and features thereof, will be more readily understood by reference to the following outline description of the application of auto-correlation and majority voting on re-tried DSSS packets.

Figure 1:
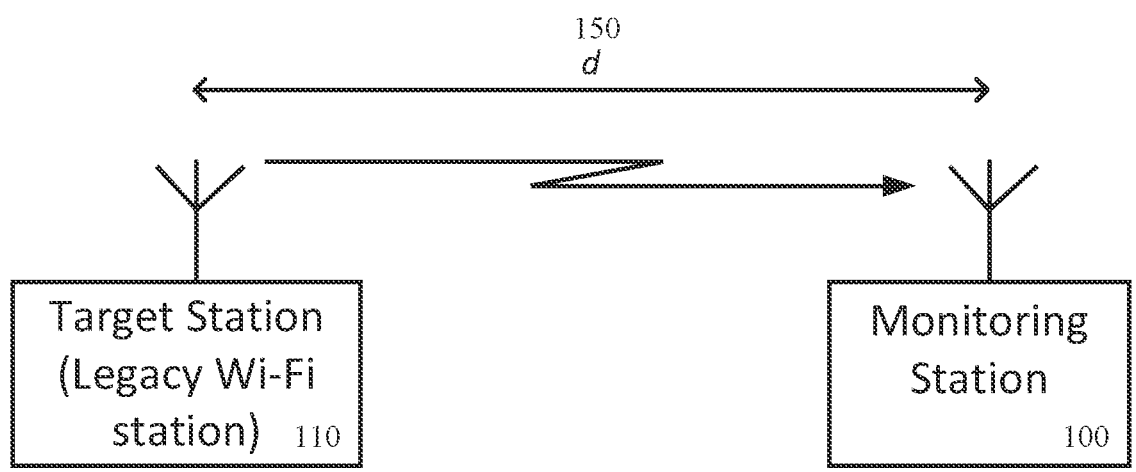
FIG. 1 is a block diagram of depicting a monitoring station receiving a communication packet from a legacy Wi-Fi device.
Figure 2:
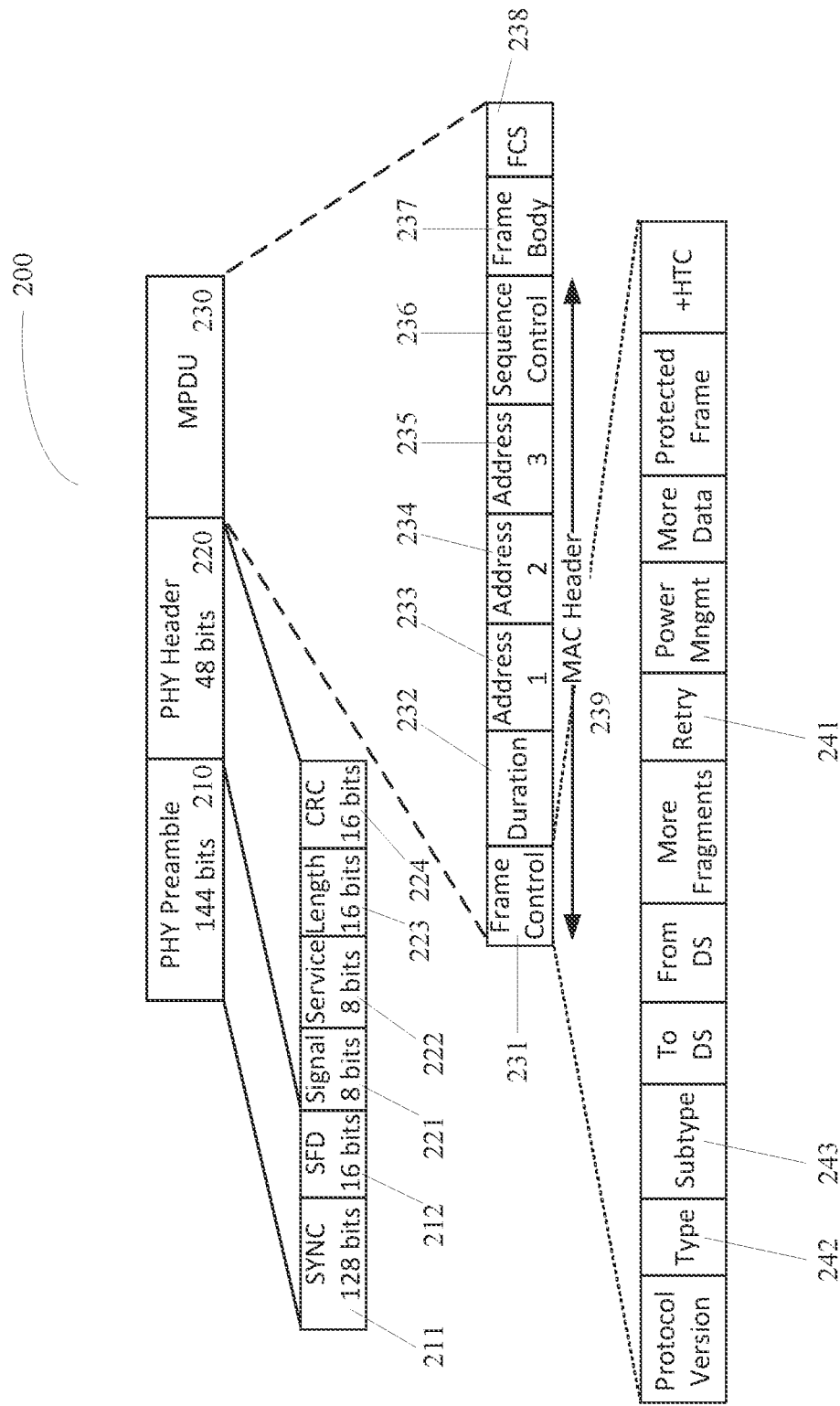
FIG. 2 is a diagram showing the format of a direct sequence spread spectrum, DSSS, data or management packet, that complies with the Standard.

Auto-correlation works by passing a known pattern across a noisy pattern. For example, the known pattern may comprise the initial bits of the received packet. With reference to FIG. 2, if the target station 110 is known, then, when receiving a wanted packet from that device, all the bits of the PHY preamble 210 and PHY header 220 are known a priori, with the possible exception of the Length field 223. Similarly, the bits of the Frame Control field 231, and in particular, the three address fields 233, 234 and 235 are known a priori. In addition, the value of the Duration field 232 may be assumed to be a standard value (e.g., 314) that covers the short interframe space SIFS and the time to transmit an ACK. If the value of the Length field 223 is known, then all the 368 received bits, up to the Sequence Control 236 are known and hence the raw scrambled bits, up to the Sequence Control field 236, can be determined. As described above, all bits are scrambled with a polynomial $G(z)=Z^{-7}+Z^{-4}+1$ before being transmitted. In determining the scrambled bits, it is necessary that all the bits are known. If a bit is in error, then the rest of the scrambled bit stream likely will have a multitude of errors. Hence, in order to determine an accurate, scrambled 368-bit stream up to the Sequence Control 236, the values of the Length 223 and CRC 224 fields must be correct. The Length field 223 is the duration of the MPDU 230, in microseconds, hence by measuring the time or number of bits that are detected by Barker code correlations, the number of bits in the packet 200 may be determined. If the number of bits in the packet 200 are known, then the values of the Length field 223 and the CRC field 224 can be calculated and then, by assuming a value for the Duration field 232, the raw bit stream, i.e., scrambled bit stream, may be derived for the PHY preamble 210, PHY header 220, and the MAC Header 239, with the possible exception of the Sequence Control 236. A correlation of the first 368 bits can provide a very high probability that the received packet is the wanted packet. It is understood that the fields/subfields of any packet and/or signal described herein may be referred to by the field/subfield name alone or by the field/subfield name and the term "field" or the term "subfield," e.g., Length 223 or Length field 223.

Correlation cannot be used on the Frame body 237 as the data therein is unknown. If the packet 200 is retried several times, however, a majority vote may be taken on each scrambled bit and then the Frame Body 237 may be re-created. Similarly, majority voting on the FCS field 238 bits may enable the FCS to be recreated. After majority voting has been carried out on the individual scrambled bits of the Frame Body 237 and FCS 238, the complete scrambled packet may be assembled and then de-scrambled. The resulting FCS may then be used to check that the complete packet has been re-assembled correctly.

A more complete understanding of the present invention, and the attendant advantages and features thereof, will be more readily understood by reference to the following detailed descriptions of majority voting and auto-correlation and derivations of their relative performances when applied to re-tried packets, as discussed above.

For DSSS 1 Mbps, the probability of a bit error, Pb, for BPSK, is $$Pb=0.5 \mathrm{erfc}\sqrt{E_b/N_0} \quad (1)$$

Where "erfc" is the Gauss complimentary error function
$E_b$ is energy per bit
$N_0$ is noise per hertz For BPSK, $E_b/N_0$ is equal to the signal to noise ratio, SNR The performance of majority voting is discussed below.

The Binomial Distribution probability mass function provides the probability, $P_k$, of exactly k successes in n trials.

$$P_k(X=k) = \binom{n}{k} p^k (1-p)^{n-k} \text{ where } \binom{n}{k} = \frac{n!}{k!(n-k)!}$$

The cumulative distribution function, CDF, provides the probability that at most k successes in n trials.

$$\mathcal{F}(k;n,p) = P_k(X \le k) = \sum_{i=0}^{k} \binom{n}{i} p^i (1-p)^{n-i}$$

For a successful "M out of N" majority vote, in N trials, no more than (N-M) bits can be in error. For example, with a 3 out of 5 majority vote, in 5 trials, no more than 2 bits may be in error. Hence, for N trials, with bit error Pb, the probability that at most (N-M) bits are in error, is the Binomial distribution CDF:

$$P_k(X \le (N-M)) = \sum_{i=0}^{N-M} \binom{N}{i} Pb^i (1-Pb)^{N-i}$$

The probability that the vote is incorrect, i.e., the new or effective bit error rate, $Pb_{eff}$, is:

$$Pb_{eff}=1-P_k(X\leq(N-M)) \quad (2)$$

For a packet consisting of B bits, with a bit error rate of $Pb_{eff}$, the packet error rate, PER, is $$PER=1-(1-Pb_{eff})^B \quad (3)$$

The received signal strength, Pr, is given by the standard formula:

$$Pr=-174+10 \log BW+NF+SNR \quad (4)$$

Where Bandwidth, BW, is 20 MHz, and let the Noise Figure, NF=3 dB. The bit error rate, Pb for varying SNR is derived from equation (1).

With DSSS, there is a theoretical ~10 dB processing gain due to the 11 bit Barker code, i.e., Processing Gain=10 Log(11). To account for implementation loss, 9 dB may be assumed for the Barker code processing gain. Hence equation (4) can be modified to:

$$Pr=-107+SNR \quad (5)$$

Figure 3:
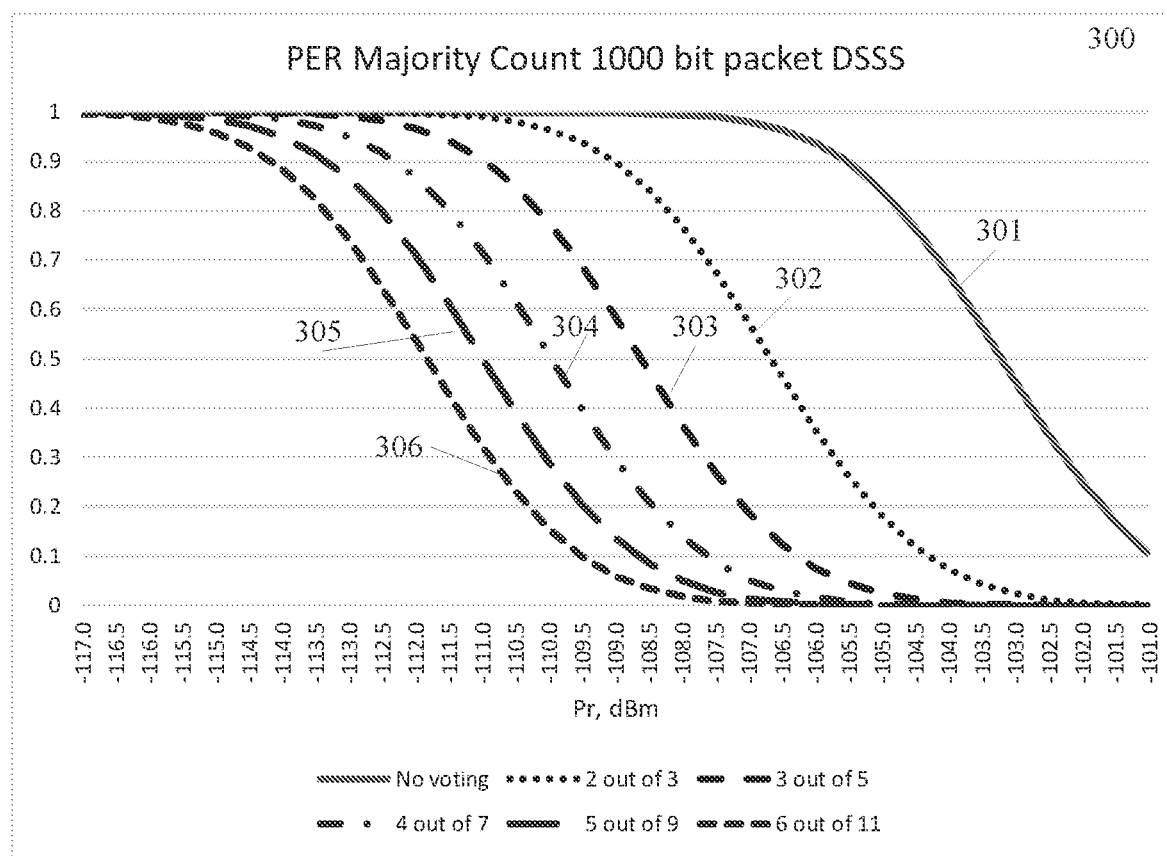
FIG. 3 is a graphical representation of the PER for majority voting of 2 out of 3, 3 out of 5, 4 out of 7, 5 out of 9, and 6 out of 11 for 1000 bits.

FIG. 3 is a graphical representation 300 of the PER for majority voting of 2 out of 3 (plot 302), 3 out of 5 (plot 303), 4 out of 7 (plot 304), 5 out of 9 (plot 305), and 6 out of 11 (plot 306) for 1000 bits. The results of PER, as per equation (3), are plotted against the received signal strength Pr, as per equation (5), for B=1000. Plot 301 is the PER for no majority vote, i.e., a single, 1000 bit packet. For a PER of 0.5, the sensitivity, Pr, for a 6 out of 11 majority vote (plot 306), is an improvement of about 9 dB over that for a single 1000 bit packet (plot 301).

Figure 4:
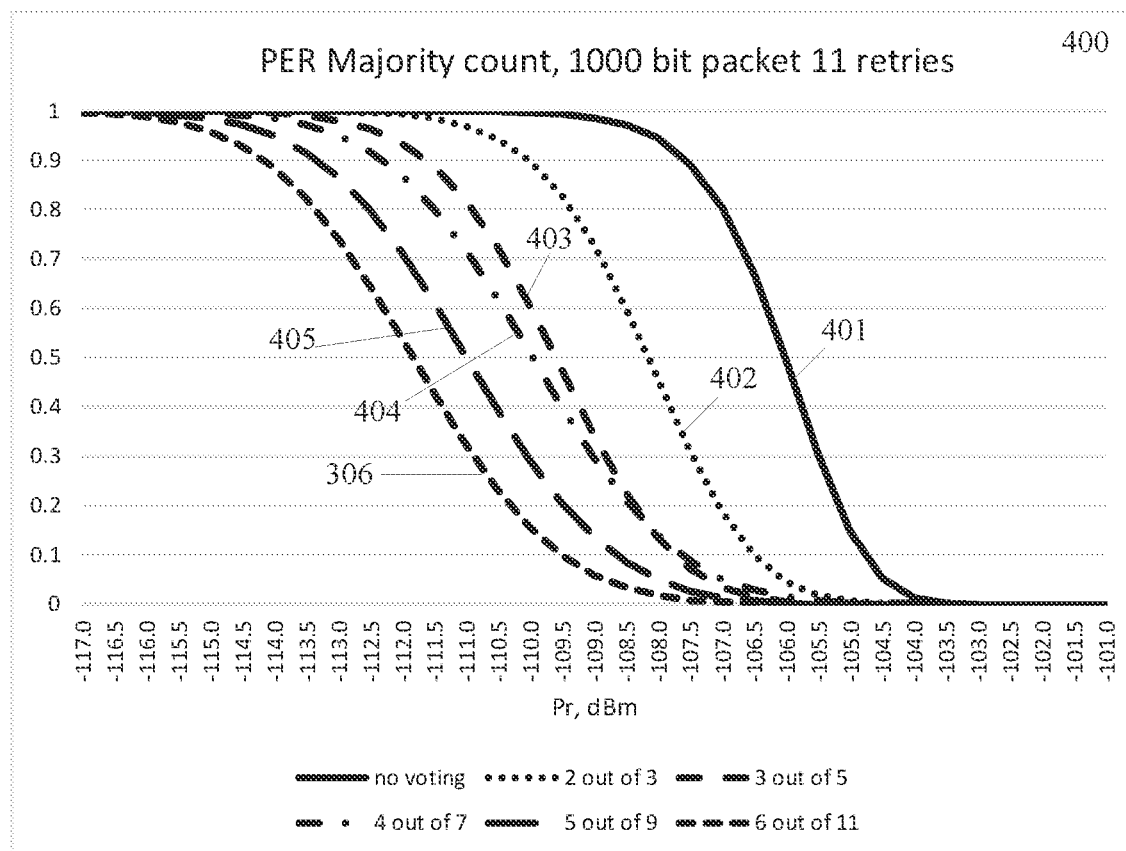
FIG. 4 is a graphical representation of the PER for majority voting of 2 out of 3, 3 out of, 4 out of 7, 5 out of 9, and 6 out of 11 for 1000 bits, for 11 retried packets.

It is noted that FIG. 3 does not account for the extra packets required for the different votes. For example, "6 out of 11" majority vote, plot 305, requires 11 packets, whereas the "no voting" plot 301 result is for just one packet. FIG. 4 is a graphical representation 400 of the PER for majority voting of 2 out of 3 (plot 402), 3 out of 5 (plot 403), 4 out of 7 (plot 404), 5 out of 9 (plot 405), and 6 out of 11 (plot 306) for 1000 bits, for 11 retried packets. Graphical representation 400 shows that for a PER of 0.5, the sensitivity, Pr, for a 6 out of 11 majority vote (plot 306) is an improvement of about 7 dB over that of 11 retried 1000 bit packets (plot 401).

Figure 5:
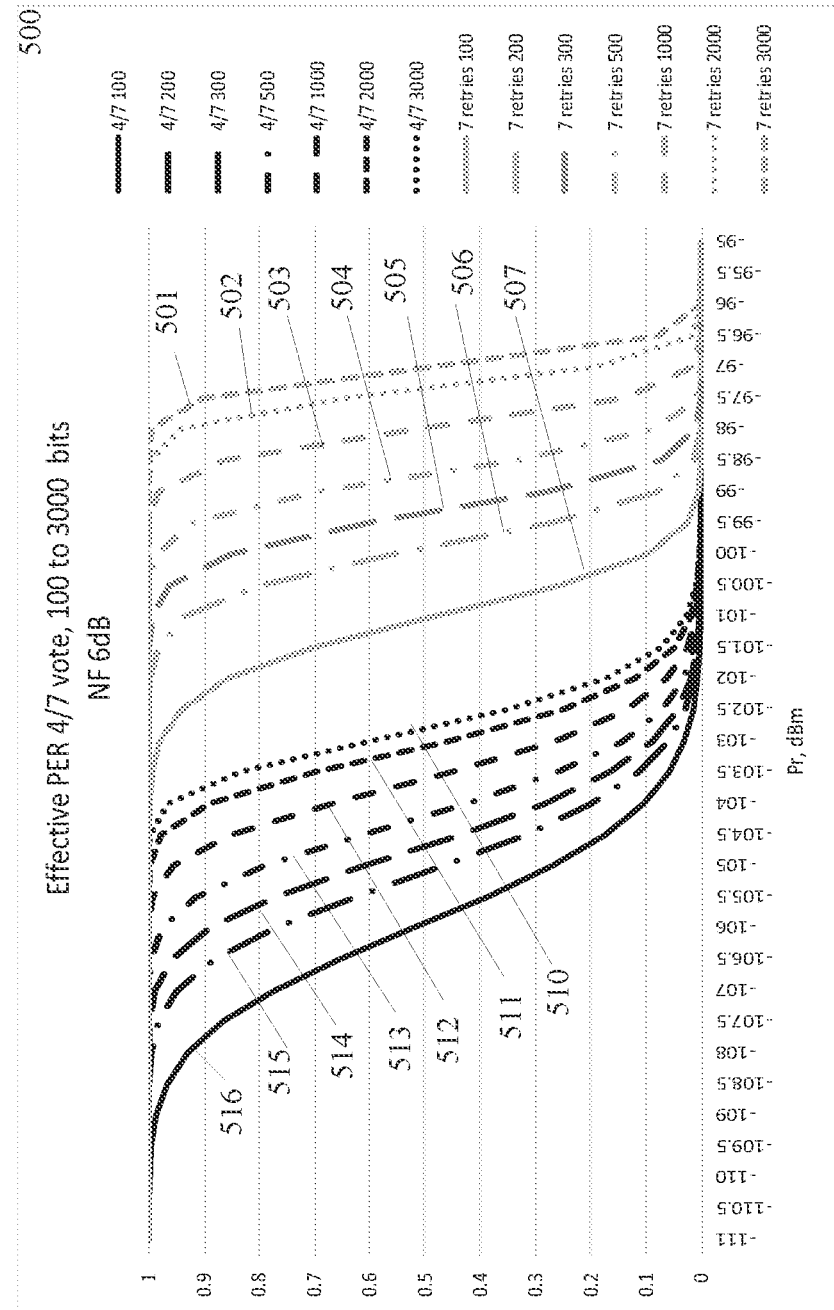
FIG. 5 is a graphical representation of PER for 4 out of 7 majority voting, compared to simple retries, for varying number of bits.

As indicated by equation (3), the fewer the number of bits in a packet, the more effective majority voting is. FIG. 5 is a graphical representation 500 of PER for 4 out of 7 majority voting, compared to simple retries, for varying number of bits. Plots 501, 502, 503, 504, 505, 506, and 507 are for 7 retries of single packets of 3000, 2000, 1000, 500, 300, 200 and 100 bits respectively. Plots 510, 511, 512, 513, 514, 515, and 516, are for 4 out of 7 majority voting on 7 packets of 3000, 2000, 1000, 500, 300, 200 and 100 bits respectively. Graphical representation 500 shows that the less bits the more effective is majority voting.

Correlation works by passing the known pattern across the noisy pattern, and if the bits/symbols agree, "correlate" or match, they add, if not, they subtract.

For a packet of B bits, B·Pb bits will not match and B(1−Pb) will match,

Hence Correlation=(Match−Mismatch)/Total $$\text{or Correlation}=(B-2B\cdot Pb)/B=(1-2Pb) \quad (6)$$

Hence, for Pb=0.2, Correlation=(1−2×0.2)=0.6 or 60% Note that for pure noise, Pb=0.5 and the correlation will be 0%.

For a given SNR, the bit error Pb may be calculated using equation (1) and the correlation calculated using equation (6). The variance and standard deviation, σ, of the mismatched bits may be calculated:

$$\sigma^2=BPb(1-Pb)$$

$$\sigma=\sqrt{BPb(1-Pb)} \quad (7)$$

For B bits, the number of mismatched bits is B Pb, with a standard deviation of σ. Hence, the number of mismatched bits=B·Pb±σ, and the number of matched bits is B−(B·Pb±σ). Thus, the correlation is given by:

$$\text{Correlation} = (B - (BPb \pm \sigma) - (BPb \pm \sigma))/B \quad (8)$$
$$= 1 - 2Pb \pm 2\sigma/B$$

Comparing (8) to (6), the following associations can be made:

$$\text{Correlation mean}=(1-2Pb) \quad (9)$$

$$\text{and Correlation standard deviation}=2\sigma/B. \quad (10)$$

Noise has a bit error rate, Pb=0.5 with a mean of zero and thus, from equation (7), $\sigma=\sqrt{B/4}$, and from equation (10) noise correlation standard deviation=$\sqrt{1/B}$ Note that the correlation mean is independent of the number of bits that are correlated. It is the standard deviation that changes; the more bits, the smaller the deviation. Note that (11) represents a thermal noise case and any increased background noise must be accounted for. For example, in the case of 3 dB and 6 dB noise figure, as used in (4) and (5), equation (11) would be modified to noise correlation standard deviation, 3 dB NF=$\sqrt{2/B}$ (11A)

noise correlation standard deviation, 6 dB NF=$\sqrt{4/B}$ (11B)

$$\text{From}(6)Pb=(1-C)/2 \quad (12)$$

And the "wanted" Correlated bits $W=B(1-Pb)=B(1+C)/2$ (13)

For example, from (13) for a Correlation of 50%, 75% of the bits will be correct.

As discussed above, if the length of a packet is unknown, a measurement of the length of the packet is fundamental to being able to determine if the received packet is the one that is of interest, i.e., so that the address fields 233, 234, and 235 can be checked to be correct. A correlation of the first 368 bits can provide a very high probability that the received packet is the wanted packet.

Three example methods of determining the value of the Length field 223 are discussed. First, if the CRC field 224 value is received correctly, then the Length field 223 value is known even if the FCS does not check correctly. Second, the values of the Signal field 221 and the Service field 222 are known a priori, hence, if the CRC field 224 value is not correct, and there are errors in either or both of the Signal 221 and Service 222 fields, the correct values for the fields can be inserted and then the CRC field 224 value re-checked. If the CRC is correct, then the values of the Length field 223 is known. Third, if the first two methods fail, then by monitoring and counting the number of Barker Code correlations, i.e., the number of de-spread bits, the Length field may be determined. The Length field is the duration of the MPDU 230, in microseconds. The measurement of the length is somewhat simplified by the fact that the MPDU will always be in octets. For example, if 5 or more out of 8 codes are correct, then it may be assumed that that octet is part of the length.

The 802.11 DSSS waveform uses an 11-chip Barker spreading sequence. When the DSSS receiver operates asynchronously to the transmitter, the receiver must align its own de-spreading process with the 11-chip symbols in the received sample stream. The incoming noisy bit stream may be sampled at 20 Msps and then correlated with the Barker sequence. Every 20 samples a finite impulse response, FIR, filter may output a correlation spike corresponding to the correlation (positive for a 1 and negative for a 0). A threshold may be set for the height of the spike so as to identify the presence of Barker code, i.e., a bit. The number of bits in a packet will also align with octets such that the packet consists of a number of octets. Thus, the correlation over 8 µs (which is 88 Barker code bits) may be used to detect if the packet is still present.

To detect that a Barker code is present, a correlation threshold can be used. The probability that noise can exceed the threshold may be calculated, as follows:

Given two independent distributions, $X \sim N(\mu_1, \sigma_1)$ and $Y \sim N(\mu_2, \sigma_2)$
The probability $P(X>Y) = P(X-Y>0) = 1 - P(X-Y \leq 0)$
By independence, $(X-Y)$ is normally distributed with $$\mu = \mu 1 - \mu 2 \text{ and } \sigma = \sqrt{\sigma_1^2 + \sigma_2^2}$$

Hence $\frac{X-Y-\mu}{\sigma} \sim N(0, 1)$ and $P(X - Y \leq 0) = \frac{X-Y-\mu}{\sigma} \leq \frac{0-\mu}{\sigma} = \phi\left(\frac{-\mu}{\sigma}\right)$ Where $\phi$ is the distribution function of the N (0,1) distribution.

$$\text{Thus } P(X > Y) = 1 - P(X - Y \leq 0) = 1 - \phi\left(\frac{-\mu}{\sigma}\right) \quad (15)$$

For various bit error rates, Pb, the mean correlation for the Barker code is given by equation (9), and the standard deviation by equation (10). For noise the correlation mean is zero and the standard deviation, is given by equation (11), (11A) or (11B).

Figure 6:
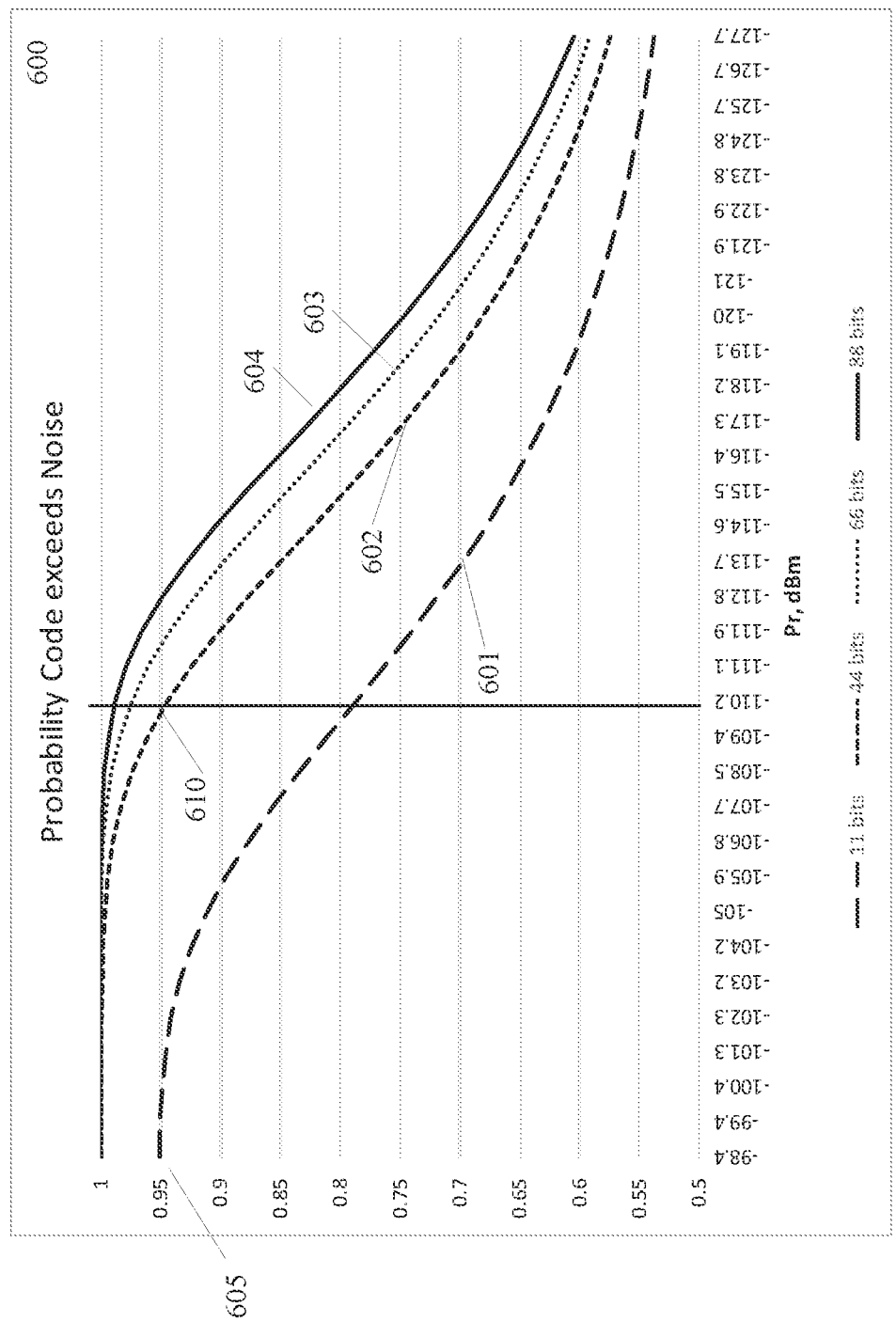
FIG. 6 is a graphical representation of the probability that the Barker code is detected above noise against received signal level Pr, for a NF=6 dB.

FIG. 6 is a graphical representation 600 of the probability that the Barker code is detected above noise against received signal level Pr, for a NF=6 dB. To account for the bit error rate, Pb, the value for Pr, derived from equations (4) and (5), is modified such that the processing gain due to the Barker code is 10 Log [11(1-Pb)]. Plot 601 is for a single Barker sequence of 11 bits. Plot 602 is for 4 Barker code sequences, 44 bits, plot 603 is for 6 code sequences, 66 bits, and plot 604 is for 8 code sequences, 88 bits. With only 11 bits, plot 601, there is always a 5% chance 605 that noise can resemble the code, even at high signal levels, but as the number of bits increases, the probability that the Barker code is correctly detected increases. At −110 dBm there is about a 95% probability 610 that 4 Barker sequences exceed noise.

Figure 7:
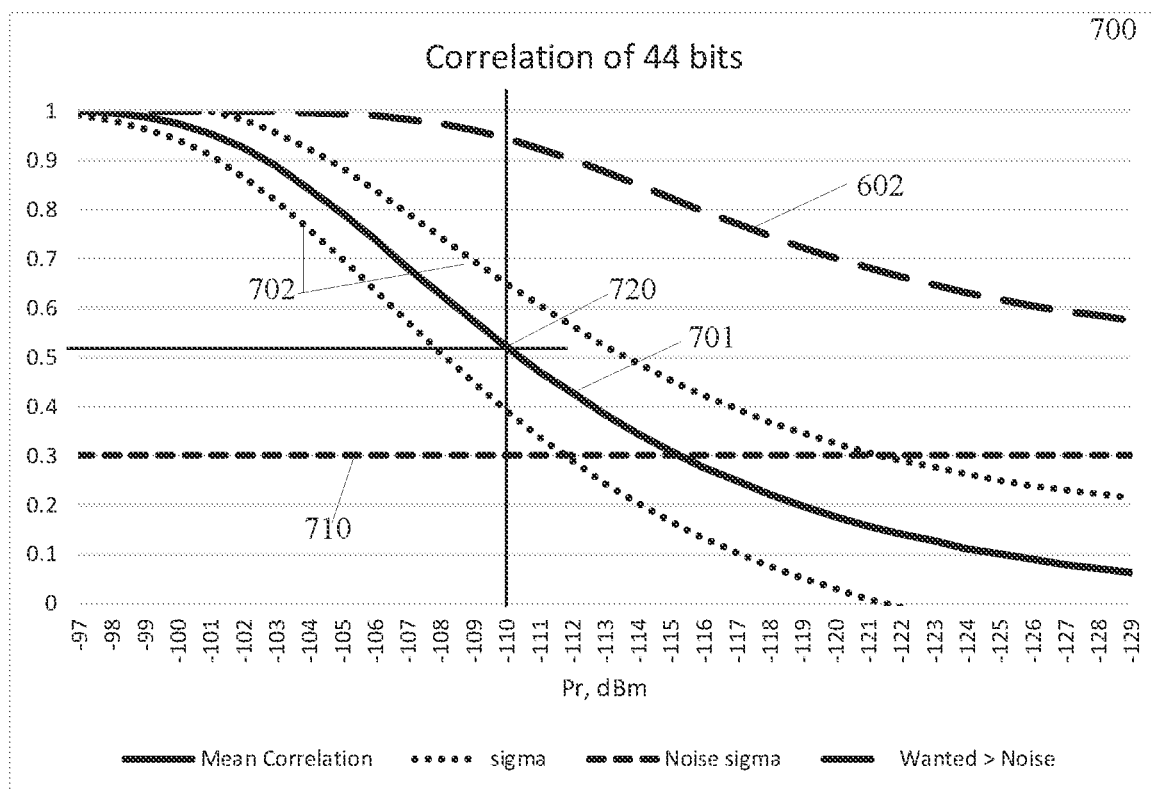
FIG. 7 is a graphical representation of the mean correlation together with the standard deviation of the correlation, and the noise standard deviation, of 44 bits (4 Barker sequences) against the received signal strength, Pr, for a NF=6 dB.

FIG. 7 is a graphical representation 700 of the mean correlation 701 together with the standard deviation 702 of the correlation, and the noise standard deviation 710, of 44 bits (4 Barker sequences) against the received signal strength, Pr, for a NF=6 dB. The probability that the wanted 44 bits exceeds the noise (plot 602) is also shown. At Pr=−110 dBm, the mean correlation 701 is 0.52 720 and the probability that the wanted exceeds the noise is 95%. Hence, the length of the received packet may be reliably measured down to a signal level in the order of −110 dBm.

As discussed above, if the value of the Length field is known, then the first 368 bits of the scrambled packet can be determined, and auto correlation may be performed against the first 368 bits of the received packet in order to determine that the packet is indeed a wanted packet from the target station 110, e.g., the legacy Wi-Fi station.

Figure 8:
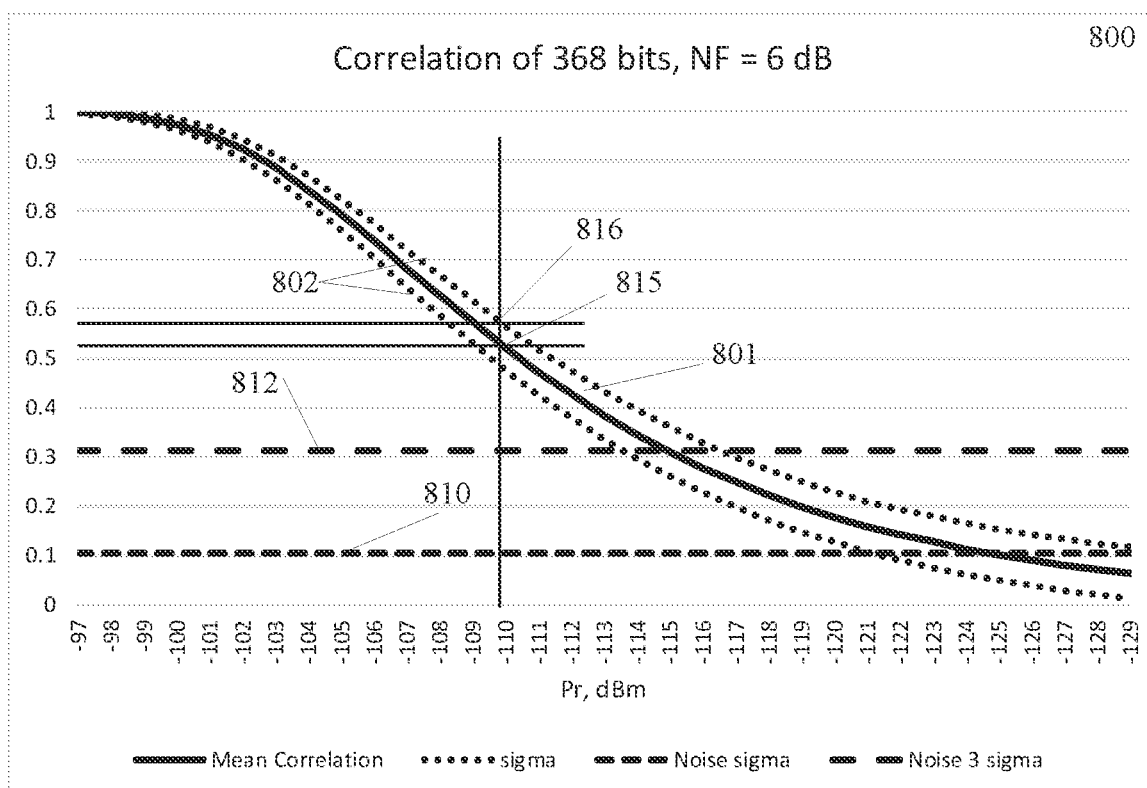
FIG. 8 is a graphical representation of the mean correlation together with the standard deviation of the correlation, the noise standard deviation, and the noise 3 times standard deviation, of 368 bits, against the received signal strength, Pr, for a NF=6 dB.

FIG. 8 is a graphical representation 800 of an example of mean correlation 801 together with the standard deviation 802 of the correlation, the noise standard deviation 810, and the noise 3 times standard deviation 812, of 368 bits, against the received signal strength, Pr, for a NF=6 dB. At Pr=−110 dBm, the mean correlation 801 has a value 815 of about 0.53, and the standard deviation 802 has a value 816 of about 0.58. These correlation thresholds are well in excess of the noise 3 times standard deviation 812 of about 0.31. Hence, correlating the "known" 368 initial bits of the received packets with a threshold of about 0.58 should enable a reliable positive identification of the wanted packet.

At a receive strength of −110 dBm and higher, and with a NF=6 dB or less, as discussed above with reference to the examples of FIGS. 6 and 7, the length of the packet can be reliably measured and the values of the Length field 223 and the CRC 224 can be determined. With knowledge of the Addresses fields 233, 234, and 235, the packet bits up to the Sequence Control field 236 may then be constructed and then scrambled. This scrambled bit stream may then be auto-correlated against the received (scrambled) bit stream and if the correlation exceeds a threshold, e.g., about 0.58, it may be reliably assumed that the received packet is indeed a "wanted" packet from the target station 110, e.g., a legacy Wi-Fi station.

Having determined that the received packet is a wanted packet, and knowing the length of the packet, the raw received bits for the Sequence Control field 236, Frame Body field 237 and FCS field 238 may then be stored. Subsequent retries of the packet can be determined by setting the Retry bit 241 to one, correlating the initial 368 bits to determine that the received packet is indeed the wanted retried packet, then storing the raw received bits for the Sequence Control field 236, Frame Body field 237 and FCS field 238. As more retried packets are received, then, as discussed above with reference to FIGS. 4 and 5, majority voting may take place on each of the raw bits that have been stored. With reference to FIG. 5, the performance of the majority voting, assuming a 4 out of 7, is such that the required received signal level is generally higher than −110 dBm, hence the majority voting performance may be considered to be the limiting factor.

Figure 9:
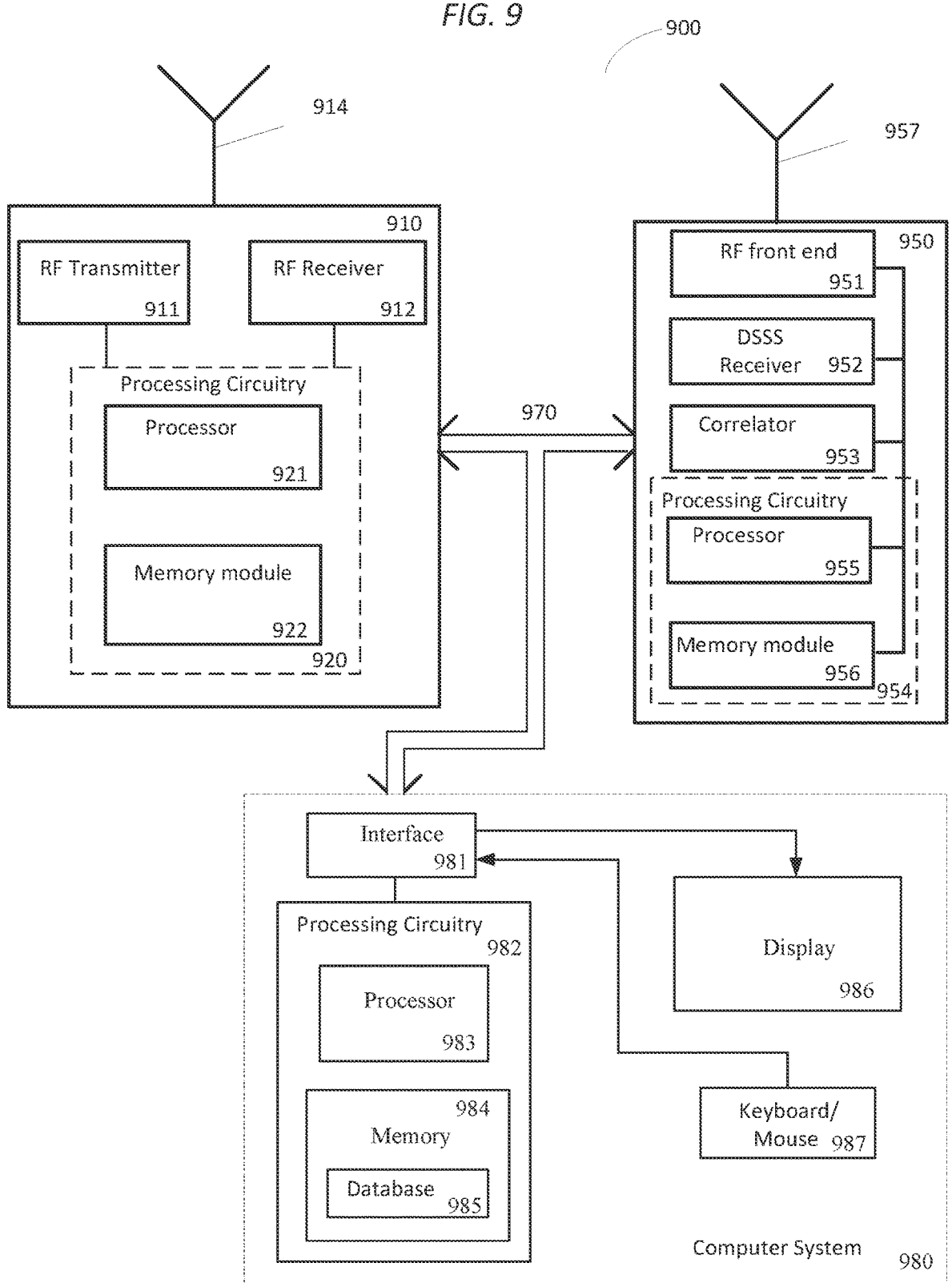
FIG. 9 illustrates a block diagram of an example wireless communication device which, according to an embodiment of the disclosure, may be used as or as part of the monitoring station, i.e., a new version of the monitoring station.

FIG. 9 illustrates a block diagram of an example wireless communication device 900 which, according to an embodiment of the disclosure, may be used as or as part of the monitoring station 100, i.e., a new version of the monitoring station 100.

The wireless communication device 900 may be a device capable of wirelessly receiving signals and transmitting signals and may be configured to execute any of the methods of the Standard. Wireless communication device 900 may be one or more stations or access points, and the like. Wireless communication device 900 may be one or more wireless devices that are based upon the Standard, and each may be configured to act as a transmitter or a receiver. The embodiment described herein is that where wireless communication device 900 includes a wireless transmitter receiver 910 and a wireless receiver 950. The wireless communication device 900 may also include a computer system 980 which is interconnected to the wireless transmitter receiver 910 and the wireless receiver 950 by a data bus 970.

In some embodiments, the wireless transmitter 910 includes an RF transmitter 911, an RF receiver 912, and processing circuitry 920 that includes processor 921, and memory module 922. The wireless transmitter receiver 910 also includes one or more wireless antennas such as wireless antenna 914. The RF transmitter 911 may perform the functions of spreading, and DSSS modulation, as described in the Standard, and amplification for the transmission of the DSSS packets via the wireless antenna 914. The RF receiver 912 may perform low noise amplification for the reception of the DSSS packets via the wireless antenna 914 and the functions of de-spreading, and DSSS demodulation, as described in the Standard. In some embodiments, the processing circuitry 920 and/or the processor 921 may comprise integrated circuitry for processing and/or control, e.g., one or more processors and/or processor cores and/or FPGAs (Field Programmable Gate Array) and/or ASICs (Application Specific Integrated Circuitry) configured to execute programmatic software instructions. In some embodiments, some functions of the RF transmitter 911 and/or the RF receiver 912 may be performed by the processing circuitry 920. The processing circuitry 920 may be configured to control any of the methods and/or processes described herein and/or to cause such methods, and/or processes to be performed, e.g., by the RF transmitter 911 or RF receiver 912. The memory module 922 may be configured to store data, programmatic software code and/or other information described herein. In some embodiments, the software may include instructions that, when executed by the processing circuitry 920, causes the processing circuitry 920 to perform the processes described herein with respect to the wireless transmitter receiver 910.

In some embodiments, the wireless receiver 950 includes an RF front end 951, a DSSS receiver 952, a correlator 953, processing circuitry 954 (that includes a processor 955 and a memory module 956) and one or more wireless antennas such as wireless antenna 957. In some embodiments, the wireless transmitter receiver 910 and the wireless receiver 950 may share the same antenna(s). The RF front end 951 may perform the usual functions of an RF receiver front end such as low noise amplification, filtering, and frequency down conversion so as to condition the received signal suitable for inputting to the DSSS receiver 952. The DSSS receiver 952 may perform the functions of Barker code detection and de-spreading of the DSSS packet so as to condition the received signal suitable for inputting to the correlator 953. The correlator 953 may perform the function of correlating the de-spread received bits with a known expected bit pattern as discussed above with reference to FIGS. 6, 7 and 8. In some embodiments, the DSSS receiver 952 and/or the correlator 953 and/or the processing circuitry 954 may comprise integrated circuitry for processing and/or control, e.g., one or more processors and/or processor cores and/or FPGAs (Field Programmable Gate Array) and/or ASICs (Application Specific Integrated Circuitry) configured to execute programmatic software instructions. In some embodiments, the functions of the DSSS receiver 952 and/or the correlator 953 may be performed by the processing circuitry 954. The processing circuitry 954 may be configured to control any of the methods and/or processes described herein and/or to cause such methods, and/or processes to be performed, e.g., by the wireless receiver 950. The memory module 956 is configured to store data, programmatic software code and/or other information described herein. In some embodiments, the software may include instructions that, when executed by the processing circuitry 954, causes the processing circuitry 954 to perform the processes described herein with respect to the wireless receiver 950.

According to this embodiment of the disclosure, the wireless receiver 950 and the RF receiver 912 may be configured to measure and monitor an input signal's attribute, such as may include one or more of data, management and control packets, transmitted by an access point or station that may be based upon the Standard. The memory modules 922 and 956 may store instructions for executing any method mentioned in the Standard, input signals, and results of processing of the processors 921 and 955, signals to be outputted and the like.

According to an embodiment of the disclosure, the RF transmitter 911 may be configured to transmit signals and the processing circuitry 920 may be configured to prepare the transmitted signal attributes based upon the Standard. Such transmitted packets may include data packets, control packets and management packets that are to be transmitted by a wireless station that is based upon the Standard. The memory module 922 may store instructions for executing any method mentioned in the specification, input signals, and results of processing of the processor 921, signals to be outputted and the like.

According to another embodiment of the disclosure, the RF wireless receiver 912 may be configured to receive the transmissions of another target station 110 such as a legacy Wi-Fi station and the processing circuitry 920 may be configured to monitor attributes of the transmissions of the other wireless communication device.

According to yet another embodiment of the disclosure, the wireless receiver 950 may be configured to receive the transmissions of another target station such as a target station 110, e.g., a legacy Wi-Fi station, and the processing circuitry 954 may be configured to monitor attributes of the transmissions of the other target station. The DSSS receiver 952 may be configured to auto-correlate the received transmission with the DSSS Barker code, and de-spread the received signal so as to produce the raw scrambled bit stream as described above with reference to FIGS. 6 and 7. In addition, according to an embodiment of the disclosure, the correlator 953 may be configured to auto-correlate the first 368 bits of the wanted packet with the received raw scrambled bit stream as discussed above with reference to FIG. 8.

According to an embodiment of the disclosure, a computer system 980 may be used to control the operations of the wireless communication device 900 and in particular the wireless transmitter receiver 910, and wireless receiver 950. The computer system 980 may include an interface 981. Interface 981 may contain a connection to the wireless transmitter receiver 910 and the wireless receiver 950, plus a connection to a display 986, a connection to a keyboard and mouse 987 as well as interfacing to the processing circuitry 982. In some embodiments, the processing circuitry 982 may include a processor 983, a memory 984, and a database 985. The database 985 may contain the details of target stations, e.g., MAC addresses and the like, and the processor 983 and memory 984 may be used to carry out the determinations of the expected scrambled bit streams, the calculations of the majority voting processes, and the de-scrambling and re-construction of the retried received packets. Information on the target station 110 may be inputted using the keyboard/mouse 987. The display 986 may be used to show the details of the target station and the re-constructed packet information.

Note that the modules discussed herein may be implemented in hardware or a combination of hardware and software. For example, the modules may be implemented by a processor executing software instructions or by application specific integrated circuitry configured to implement the functions attributable to the modules. Also note that the term "connected to" as used herein refers to "being in communication with" and is not intended to mean a physical connection nor a direct connection. It is contemplated that the signal path between one element and another may traverse multiple physical devices.

Thus, in some embodiments, the processing circuitry 982 may include the memory 984 and a processor 983, the memory 984 containing instructions which, when executed by the processor 983, configure the processor 983 to perform the one or more functions described herein. In addition to a traditional processor and memory, the processing circuitry 982 may comprise integrated circuitry for processing and/or control, e.g., one or more processors and/or processor cores and/or FPGAs (Field Programmable Gate Array) and/or ASICs (Application Specific Integrated Circuitry).

The processing circuitry 982 may include and/or be connected to and/or be configured for accessing (e.g., writing to and/or reading from) the memory 984, which may include any kind of volatile and/or non-volatile memory, e.g., cache and/or buffer memory and/or RAM (Random Access Memory) and/or ROM (Read-Only Memory) and/or optical memory and/or EPROM (Erasable Programmable Read-Only Memory). Such memory 984 may be configured to store code executable by control circuitry and/or other data, e.g., data pertaining to communication, e.g., configuration and/or address data of nodes, etc. The processing circuitry 982 may be configured to control any of the methods described herein and/or to cause such methods to be performed, e.g., by the processor 983. Corresponding instructions may be stored in the memory 984, which may be readable and/or readably connected to the processing circuitry 982. In other words, the processing circuitry 982 may include a controller, which may comprise a microprocessor and/or microcontroller and/or FPGA (Field-Programmable Gate Array) device and/or ASIC (Application Specific Integrated Circuit) device. It may be considered that the processing circuitry 982 includes or may be connected or connectable to memory, which may be configured to be accessible for reading and/or writing by the controller and/or processing circuitry 982. It is also noted that the elements of the wireless communication device 900 can be included in a single physical device/housing or can be distributed among several different physical devices/housings.

Figure 10:
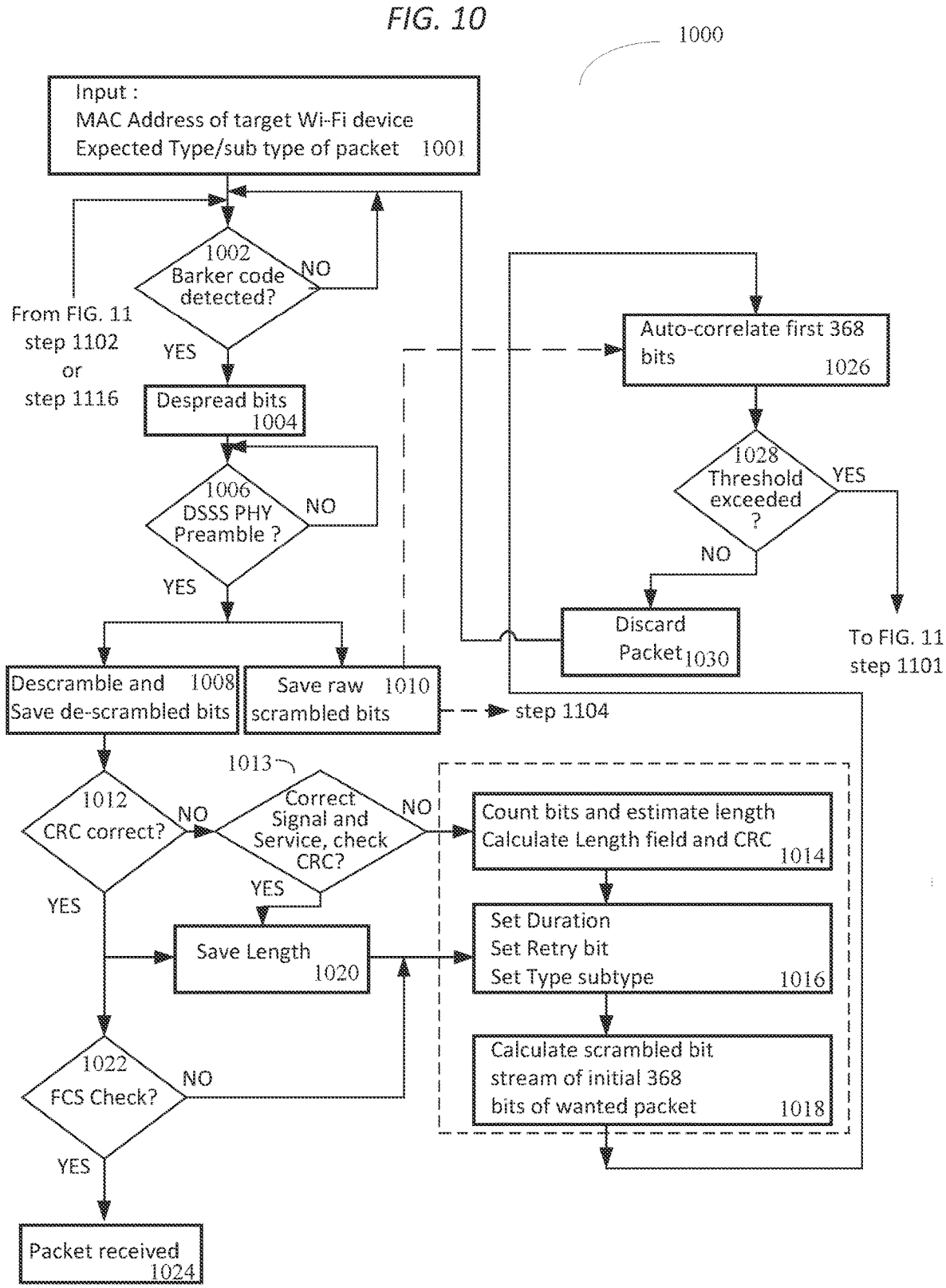
FIGS. 10 and 11 form a flow diagram of an example of one embodiment of a method for the correction of data or management packets, received from a target Wi-Fi device, with bit errors, utilizing the wireless communications device, which according to an embodiment of the disclosure may be used as or as part of the monitoring station.
Figure 11:
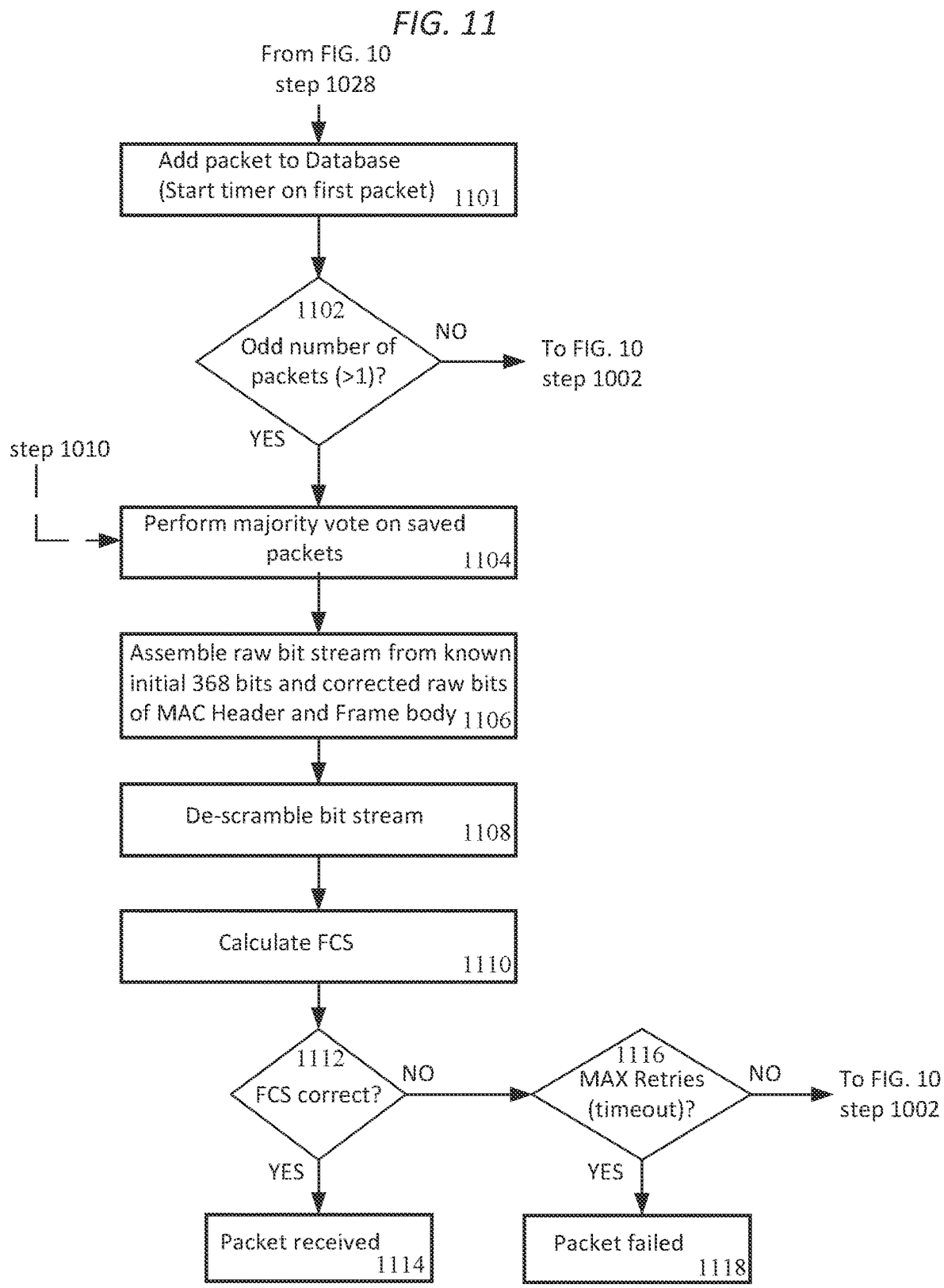

FIGS. 10 and 11 form a flow diagram of an example of one embodiment of a method 1000 for the correction of data or management packets, received from a target station 110, with bit errors, utilizing the wireless communications device 900, which according to an embodiment of the disclosure may be used as or as part of the monitoring station 100. The method may start with step 1001 where the MAC address of the target station 110 may be entered together with the Type 242 and Subtype 243 values of the wanted packet. These values may be entered using the keyboard/mouse 987 and inputted to the processing circuitry 954 in the wireless receiver 950. The Barker code is detected at step 1002 to indicate the start of reception of a DSSS packet. If a Barker code is detected at step 1002, the bits may be de-spread at step 1004. Then at step 1006 a correlation may be carried out against the PHY preamble 210 to confirm that a DSSS packet is indeed being received. The Barker code detection may be carried out by the DSSS receiver 952. The auto-correlation of the PHY preamble 210 may be performed by the correlator 953 with the raw scrambled PHY header bit stream being inputted from the processing circuitry 954. If, at step 1006 the correlation of the PHY header exceeds a threshold, then it may be assumed that a DSSS packet is being received. The decoded, scrambled bit stream may then be saved at step 1010 and the de-scrambled bit stream may be saved at step 1008. The de-scrambling of the received bit stream may be performed by the processing circuitry 954 and the de-scrambled and scrambled bit streams may be saved in the memory module 956 via processor 955.

At step 1012 the CRC 224 may be checked for the de-scrambled bit stream of the PHY header 220 and if it is correct, then at step 1020 the value of the Length field 223 may be saved. If the CRC is not correct, then it is known that there are errors in the PHY header 220. The values of the Signal 221 and Service 222 fields are known a priori and a check may be made, at step 1013, to see if they have been correctly received and, if not, corrected. The CRC check may then be repeated and, if correct, the value for the Length field 223 is known and may be saved at step 1020. If the values for the Signal 221 and Service 222 fields were correct in step 1013, then it may be assumed that the Length field 223 is in error. If the CRC was correct at step 1012, then at step 1022 a check on the FCS 238 may be made. If the FCS value is correct, then at step 1024 it may be declared that the packet has been received and the method ends. The Signal, Service and CRC checks and the possible replacement of the Service and Signal fields may be performed by the processing circuitry 954. The packet may also be received by RF receiver 912 in wireless transmitter receiver 910, and, after de-coding and de-scrambling by the processing circuitry 920 the FCS is correct, then the packet has been correctly received and wireless receiver 950 may be informed via the data bus 970.

If steps 1012 and 1013 both fail then, at step 1014, the number of de-coded bits, as stored at step 1010, may be counted and the length of the packet may then be calculated, as discussed above with reference to FIGS. 6 and 7. Values for the Length field 223 and CRC 224 may then be calculated using the known values of the other fields in the PHY header 220. Then, at step 1016, a value of 314 may be assumed for the Duration field 232 and the Retry bit 241 may be set to zero or one, dependent upon the assumption that this packet is the initial packet or a retry. Also, at step 1016 the values for the type 242 and subtype 243 of the wanted packet may be entered. If, at step 1022, the FCS check fails, then the method may advance to step 1016. The complete initial 368 scrambled bits of the wanted packet may now be assembled at step 1018 and at step 1026 an auto-correlation of the 368 scrambled bits, as determined at step 1018, is carried out with the initial 368 raw scrambled bits stored at step 1010. If the auto-correlation fails, i.e., as discussed above with reference to FIG. 8 and the correlation does not exceed a set threshold, then the packet may, at step 1030, be discarded and the method returns to step 1002. If the auto-correlation is successful, then the method advances to FIG. 11, step 1101. Steps 1013, 1014, 1016, and 1018 may all be performed by the processing circuitry 954.

At step 1101, the entire scrambled packet, as stored at step 1010 but with the initial 368 bits set as determined at step 1018, may be stored. The packet(s) may be stored in memory module 956 or database 985. At step 1102 a check is made of the number of (retried) packets in the store and if it is an odd number greater than 1, i.e., 3, 5, 7, 9, etc., then a majority vote may be performed, at step 1104, on each corresponding scrambled bit of the stored packets, from the Sequence Control field 236 to the end of the FCS 238. If the check at step 1102 fails, then the method returns to step 1002 to await a new packet. The process of majority voting is discussed above with reference to FIGS. 3, 4 and 5, and equations (2) and (3). Based upon the results of the majority voting in step 1104, plus the "known" scrambled bits for the 368 bits of the packet up to the Sequence Control field 236, a complete raw scrambled bit stream for the entire packet may be assembled (step 1106). In step 1108 the bit stream may be de-scrambled and at step 1110 the FCS check may be carried out. If, at step 1112, the FCS check is successful, then at step 1114 the packet may be declared as being received and the method ends. If the FCS check at step 1112 is not successful, then a check is made at step 1116 to assess if the maximum number of expected retries has been reached, i.e., can at least two more retried packets be expected? If yes, then the method returns to step 1002, but if no, then, at step 1118 the packet is declared as having failed and the method ends. The processes of majority voting, assembling the scrambled packet, de-scrambling the bit stream, calculating the FCS, and checking the FCS may be all performed by the processing circuitry 954 and/or the processing circuitry 982.

If a value for the maximum number of retries, as used at step 1116, is higher than the maximum number of retries that the target station 110, e.g., the legacy Wi-Fi station, may be using, or, if too many re-tried packets fail, then a timeout may be required to prevent the method 1000 from endlessly looping. For example, a timer may be set to start at step 1101 after the first successful auto-correlation at step 1028 and if that packet, with re-tries, is not successful, i.e., is not declared "received" at steps 1112 or 1024 within a preset time, then that packet may be abandoned. A timeout check at step 1116 may be used. At step 1016 the values for the type 242 and subtype 243 of the packet may be set. In the event that the type and subtype of the packet are not specifically known then different values may be chosen, in turn, and steps 1018, 1026 and 1028 repeated until in step 1028 the threshold is exceeded, or a maximum correlation is found, and thus the values of the type 242 and subtype 243 established.

Figure 12:
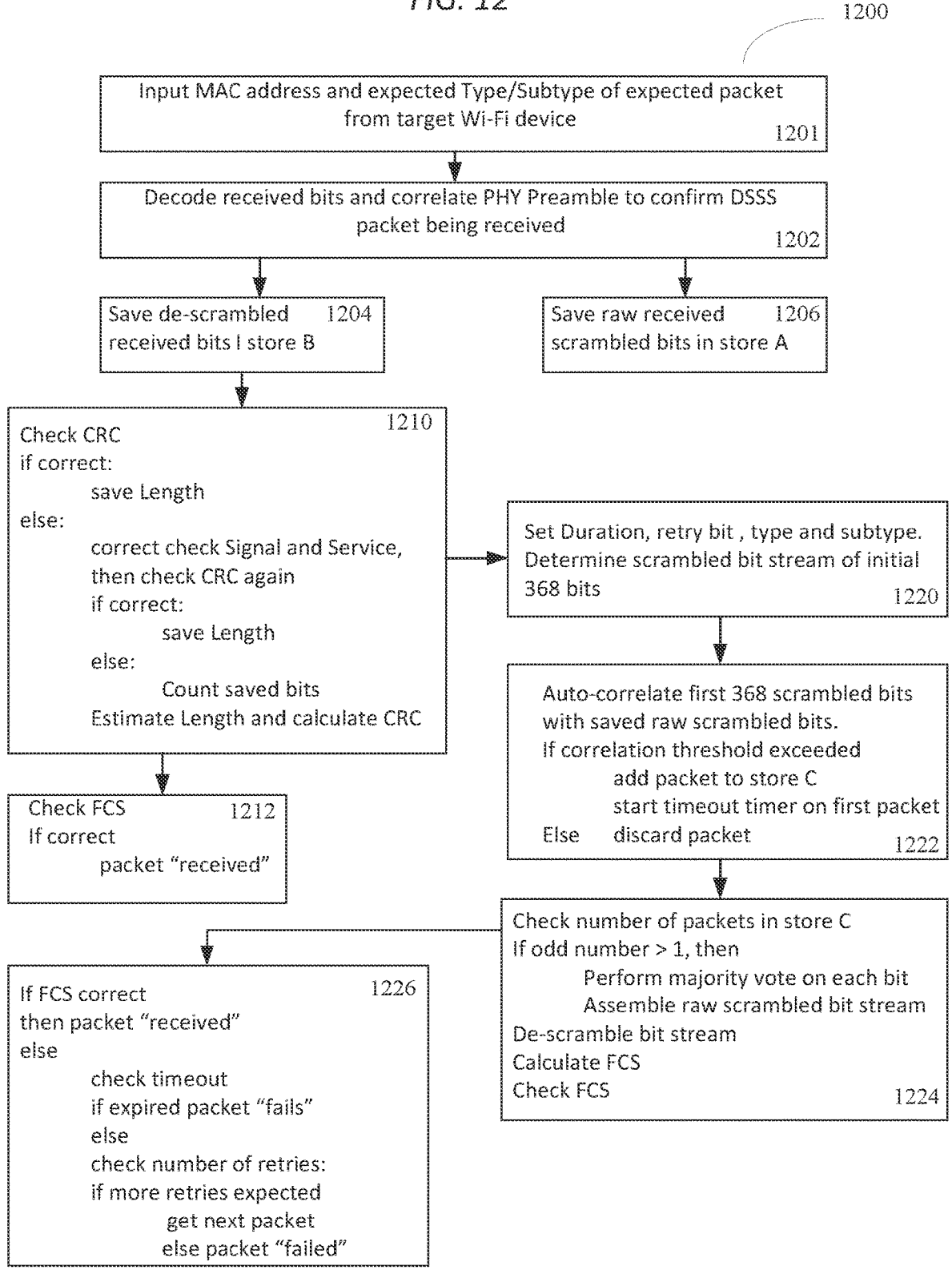
FIG. 12 is a flowchart of an exemplary process that corrects data or management packets, received with bit errors, from a target Wi-Fi device, utilizing the wireless communications device, which according to an embodiment of the disclosure may be used as or as part of the monitoring station.

FIG. 12 is a flowchart of an exemplary process 1200 that corrects data or management packets, received with bit errors, from a target station 110, utilizing the wireless communications device 900, which according to an embodiment of the disclosure may be used as or as part of the monitoring station 100. The process includes inputting, such as via the keyboard/mouse 987, the MAC address and expected type 242 and subtype 243 values of the wanted packet from the target station 110 (step 1201). Received symbols, via RF front end 951, are correlated with the Barker code, de-coded via the DSSS receiver 952, and correlated, via the correlator 953, against the PHY preamble 210 to confirm that a DSSS packet is being received (step 1202). The raw received scrambled bit stream is then stored, in "store A", via the processor 955, in the memory module 956, of the processing circuitry 954 (step 1206). The scrambled bit stream is also de-scrambled and stored in "store B", via the processor 955, in the memory module 956, of the processing circuitry 954 (step 1204). In step 1210, the value of the CRC 224 of the de-scrambled bit stream is checked and if correct the value of the Length field 223 is noted. If the CRC check fails, then the values of the signal 221 and service 222 fields are examined. These values are known a priori and hence if they are not correct, they can be corrected, the CRC checked again and, if correct, the value of the Length field 223 is noted. If the CRC is still incorrect then the value for the Length field 223 is estimated by counting the stored raw scrambled bits in "store A", step 1206. Using the estimated length value, a CRC value is calculated. The processes carried out in step 1210 may be performed by the processing circuitry 954.

The process further includes setting the Duration field 232, the retry bit, 241, the type 242 and subtype 243 values and then determining the initial 368 bits of the raw scrambled bit stream of the wanted packet (step 1220). In step 1222, the initial 368 bits determined in step 1220, are auto-correlated against the initial 368 bits of the received raw bit stream stored in step 1206, (store A). If the correlation exceeds a preset threshold, then the complete packet, stored at step 1206, is added to another store, "store C". If this is the first packet, then a timeout timer is started. If the correlation does not exceed a preset threshold, then the complete packet, stored at step 1206, is assumed to not be a wanted packet, and is discarded. The process further includes step 1224 where the number packets in store C is checked, and if that number is an odd number greater than 1, then a majority vote is performed on each corresponding bit of the raw bit streams of the packets (store C). The scrambled bit stream is then assembled, based upon the results of the majority voting, and the bit stream then de-scrambled. The FCS check is then carried out in step 1226. If the FCS check is successful, then the packet is "received". If the FCS fails, then it is first checked if the timeout timer is still valid. If not, the packet fails and the process ends. Else, if the FCS fails, it is checked if more retried packets are expected and if so, the process returns to step 1202 where a new wanted packet is received. In some embodiments, Stores A and B are contained within the memory module 956 and store C resides in the database 985. The process of majority voting takes place via the processing circuitry 982 and the re-assembly of the packet, de-scrambling and FCS check is also performed in the processing circuitry 982.

The received bit stream is also received via the wireless transmitter receiver 910 (e.g., a standard transmitter receiver), via RF receiver 912, de-coded and de-scrambled and processed in the processing circuitry 920. If the received packet FCS is correct, and the address fields 233, 234 and 235 are as expected, then exemplary process 1200 is not required as the wanted packet has been successfully received.

At step 1210 if the value of the Length field 223 is estimated, then the estimated value will be in units of 8 as the MPDU is always a number of octets. If, for example, there are two possible estimates, then each value is used, the corresponding CRC calculated, and steps 1220, 1222 repeated for each value. The higher correlation in step 1222 is used to indicate the better length estimate. Similarly, if the type 242 and subtype 243 values are not precisely known, then different values may be used and again the selection with the highest correlation in step 1222 used.

If, at steps 1024, 1114, 1212 and 1226, the packet is "received", an acknowledgement ACK packet is sent, such as via RF transmitter 911, to the target station 110, e.g., the Wi-Fi station.

FIG. 13 is another flowchart of an exemplary process 1300 for creating a corrected packet based in part on the majority vote. The exemplary process 1300 may be implemented in a first wireless device (WD) that supports wireless communication with a second WD. At step 1301, a plurality of wireless packets is received from the second WD including at least a first wireless packet. At least another wireless packet of the plurality of wireless packets is one of a retry packet and a repeat packet of the first packet. Each wireless packet of the plurality of wireless packets comprises a plurality of bits and a first group of bits of the plurality of bits.

For each received wireless packet of the plurality of wireless packets, at step 1302, the plurality of bits corresponding to the received wireless packet is demodulated, and, at step 1303, the first group of bits is correlated with a predetermined group of bits. At step 1304, a majority vote is performed based at least in part on the correlation of the first group of bits of each received wireless packet. At step 1305, a corrected packet is created based in part on the majority vote.

Demodulating as used in the present disclosure may include determining and/or extracting information from a signal, e.g., determining/extracting information from a signal including a plurality of bits. In some embodiments, demodulating may include de-spreading, as described in the present disclosure, e.g., de-spreading at least one bit from a plurality of bits of a signal such as a signal that includes spread bits. In some other embodiments, demodulating may include de-scrambling, as described in the present disclosure, e.g., de-scrambling at least one bit from a plurality of bits of a signal such as a signal that includes scrambled bits. Although demodulating may include de-spreading and/or de-scrambling, demodulating is not limited to including de-spreading and/or de-scrambling and may include other steps/features described in the present disclosure.

The following is a nonlimiting list of embodiments according to the principles of the present disclosure:

Embodiment 1. A method in a first wireless device WD for the correction of wireless packets received with bit errors, the method comprising:
  receiving a plurality of bit streams, transmitted from a second WD, of a repeated or re-tried wireless packet, each with bit errors, the wireless packet comprising:
    a portion A of the bit stream that is known a priori, and
    a portion B of the bit stream that is unknown; and
  for each received packet:
    demodulating the received bit stream corresponding to the received packet;
    correlating portion A, with the known bit stream;
    determining that the correlation exceeds a set threshold;
    storing the received bit stream corresponding to the received packet in a store C;
    determining that there are an odd number, greater than 1, of stored received bit streams;
    performing a majority vote on each corresponding bit of each stored bit stream;
    re-creating a "corrected" bit stream using the results of the majority count and the portion A; and
    checking whether the re-created "corrected" bit stream is error free.

Embodiment 2. The method of Embodiment 1, wherein the received bit stream is an IEEE 802.11 direct sequence spread spectrum (DSSS) where:
  portion A comprises the de-spread, scrambled bits of the PHY Preamble field, PHY Header field and the medium access control, MAC Header up to the Sequence Control;
  portion B comprises de-spread, scrambled bits of the Sequence control, frame body and frame check sum FCS fields.

Embodiment 3. The method of Embodiment 2 wherein:
  the de-spread scrambled bit stream is stored in a store A; and
  the de-spread de-scrambled bit stream is stored in a store B.

Embodiment 4. The method of Embodiment 3, wherein the value of the Length field in the PHY header is determined by one of the following methods:
  checking the CRC value of the de-spread, scrambled PHY header bits, in store B, and if correct, saving the Length value;
  or;
  if the CRC is not correct and the (known) values of the Signal and/or Service fields are incorrect:
    correcting the values of the Service and Signal fields:
    re-checking the CRC value of the corrected de-spread, scrambled PHY header bits, and, if correct, saving the Length value;
  or;
  counting the number of bits stored in store A and estimating the value of the Length field based upon that count, and calculating a CRC value using that estimation.

Embodiment 5. The method of Embodiment 4, wherein the values for the following fields are set:
  Duration field value is set to 314;
  Retry bit is set to a 0 for the first received packet and the set to 1 for any subsequent, retired packets; and
  Type and Subtype fields are set to correspond to the expected or desired packet type.

Embodiment 6. The method of Embodiment 5, wherein:
  calculating the initial 368 scrambled bits of the error free version of the received bit stream, comprising:
    known a priori values of the PHY preamble;
    known a priori values of the Signal field, and the Service field;
    determined or estimated values of the Length field and CRC;
    Frame control field, assuming values for the Duration field, Type and subtype fields; and
    known a priori Address 1, Address 2 and Address 3 fields;
  auto-correlating the initial 368 calculated scrambled bits of the error free version of the received bit stream, with the first 368 bits of the received bit stream (store A);
  determining that a correlation threshold has been exceeded;
  storing the received bit stream in store C;
  determining that there are an odd number, greater than 1, of stored received bit streams in store C;
  performing a majority vote on each corresponding bit of each stored bit stream (store C);
  re-creating a "corrected" bit stream using the results of the majority count and the initial 368 scrambled bits of the error free version of the received bit stream;
  performing a check on the FCS value of the re-created "corrected" bit stream; and if correct; and
  determining that the packet has been received correctly.

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD ROMs, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (which when programmed as described herein forms a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object-oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

While the above description contains many specifics, these should not be construed as limitations on the scope, but rather as an exemplification of several embodiments thereof. Many other variants are possible including, for examples: the choices of correlation thresholds, the number of stores, the number of trials for the majority voting, the number of bits used for the auto-correlation, the number of maximum retries, the value of a timeout timer, the method of measuring the Length field. Accordingly, the scope should be determined not by the embodiments illustrated, but by the claims and their legal equivalents.

It will be appreciated by persons skilled in the art that the present invention is not limited to what has been particularly shown and described herein above. In addition, unless mention was made above to the contrary, it should be noted that all of the accompanying drawings are not to scale.

A variety of modifications and variations are possible in light of the above teachings without departing from the scope of the following claims.

What is claimed is:

1. A method for a first wireless device (WD) supporting wireless communication with a second WD, the method comprising:
    receiving a plurality of wireless packets from the second WD including at least a first wireless packet and a plurality of retried wireless packets, each wireless packet of the plurality of wireless packets comprising at least a first group of bits, the first group of bits corresponding to a known set of bits;
    for each received wireless packet of the plurality of wireless packets:
        correlating the first group of bits with the known set of bits;
        comparing a result of the correlating to a first threshold;
        de-spreading a plurality of bits of the received wireless packet;
        storing the de-spread plurality of bits in a first location;
        determining whether the correlation of the first group of bits in the first location exceeds a predetermined threshold; and
        storing the de-spread plurality of bits in the first location in a third location when the correlation of the first group of bits exceeds the predetermined threshold;
    determining when the number N out of M packets exceeds the first threshold, M being a number of bits in the third location; and
    creating a corrected packet based at least in part on whether a number of comparison results exceeding the first threshold is greater than N out of M received packets, M being an integer and N being an integer greater than N.

2. The method of claim 1, wherein each wireless packet of the plurality of wireless packets is a direct sequence spread spectrum (DSSS) packet, each wireless packet further including a second group of bits and comprising a plurality of fields, each field of the plurality of fields including at least one bit of the plurality of bits, the plurality of fields including a physical layer (PHY) preamble field, a PHY header field, and medium access control (MAC) header field, a sequence control field, a frame body field, and a frame check sum (FCS) field, the first group of bits including bits of the de-spread plurality of bits that are part of at least one of the PHY preamble field, the PHY header field, and the MAC header field, the second group of bits including bits of the de-spread plurality of bits that are part of at least one of the sequence control field, the frame body field, and the FCS field.

3. The method of claim 2, wherein the plurality of fields further includes a cyclic redundancy check (CRC) field, a length field that is part of the PHY header field, a signal field, and a service field, the method further including, for each received wireless packet:
  performing a CRC check of bits, the CRC check of bits including determining whether a CRC value of PHY header field bits stored in the first location is correct;
  when the CRC value is correct, determining a value of the length field;
  when the CRC value is incorrect and a value of at least one of the signal field and the service field is incorrect:
    correcting the value of at least one of the signal field and the service field; performing the CRC check of bits; and when the CRC value is correct, determining the value of the length field.

4. The method of claim 2, wherein the plurality of fields further includes a cyclic redundancy check (CRC) field and a length field that is part of the PHY header field, a signal field, and a service field and the method further includes determining a value of the length field includes at least one of:
  determining whether the CRC value is correct;
  determining whether at least one of the signal field and the service field have errors; and
  determining a number of Barker code correlations.

5. The method of claim 2, wherein the plurality of fields further includes a cyclic redundancy check (CRC) field, a length field that is part of the PHY header field, the method further including, for each received wireless packet:
  determining a number of de-spread bits stored in the first location;
  determining a value of the length field based upon the determined number of de-spread bits; and
  determining a CRC value using the determined value of the length field.

6. The method of claim 5, wherein a first total number of bits is determined based in part on one value of at least one field of the plurality of fields and an estimated value of at least another field of the plurality of fields.

7. The method of claim 2, wherein the plurality of fields further includes a duration field, a retry field, a type field, and a subtype field, the method further including:
  setting a value of the duration field to a predetermined duration field value;
  setting a value of the retry field to 0 for a first received wireless packet and the value of the retry field to 1 for a second received wireless packet; and
  setting each of a value of the type field to a predetermined type field value and a value of the subtype field to a predetermined subtype field value.

8. The method of claim 1, wherein, when a number of received packets is an odd number, greater than 1, creating the corrected packet includes:
  assembling a new plurality of scrambled bits based at least in part on whether the number of comparison results exceeding the first threshold is greater than N;
  de-scrambling the new plurality of scrambled bits; and
  creating the corrected packet further from the de-scrambled new plurality of scrambled bits.

9. The method of claim 1, the method further including:
  determining the corrected packet is error free by performing a frame check sum (FCS); and
  transmitting an acknowledgement (ACK) signal to the second WD.

10. A first wireless device (WD) supporting wireless communication with a second WD, the first WD comprising:
  a transmitter receiver configured to:
    receive a plurality of wireless packets from the second WD including at least a first wireless packet and a plurality of retried wireless packets, each wireless packet of the plurality of wireless packets comprising at least a first group of bits, the first group of bits corresponding to a known set of bits; and
  processing circuitry in communication with the transmitter receiver, the processing circuitry being configured to,
    for each received wireless packet of the plurality of wireless packets:
      correlate the first group of bits with the known set of bits;
      compare a result of the correlating to a first threshold;
      de-spread a plurality of bits of the received wireless packet;
      store the de-spread plurality of bits in a first location;
      determine whether the correlation of the first group of bits in the first location exceeds a predetermined threshold; and
      store the de-spread plurality of bits in the first location in a third location when the correlation of the first group of bits exceeds the predetermined threshold;
    determine when the number N out of M packets exceeds the first threshold, M being a number of bits in the third location; and
    create a corrected packet based at least in part on whether a number of comparison results exceeding the first threshold is greater than N out of M received packets, M being an integer and N being an integer greater than N.

11. The first WD of claim 10, wherein each wireless packet of the plurality of wireless packets is a direct sequence spread spectrum (DSSS) packet, each wireless packet further including a second group of bits and comprising a plurality of fields, each field of the plurality of fields including at least one bit of the plurality of bits, the plurality of fields including a physical layer (PHY) preamble field, a PHY header field, and medium access control (MAC) header field, a sequence control field, a frame body field, and a frame check sum (FCS) field, the first group of bits including bits of the de-spread plurality of bits that are part of at least one of the PHY preamble field, the PHY header field, and the MAC header field, the second group of bits including bits of the de-spread plurality of bits that are part of at least one of the sequence control field, the frame body field, and the FCS field.

12. The first WD of claim 11, wherein the plurality of fields further includes a cyclic redundancy check (CRC) field, a length field that is part of the PHY header field, a signal field, and a service field, the processing circuitry being further configured to, for each received wireless packet:
  perform a CRC check of bits, the CRC check of bits including determining whether a CRC value of PHY header field bits that stored in the first location is correct;
  when the CRC value is correct, determine a value of the length field;
  when the CRC value is incorrect and a value of at least one of the signal field and the service field is incorrect:
    correct the value of at least one of the signal field and the service field; perform the CRC check of bits; and when the CRC value is correct, determine the value of the length field.

13. The first WD of claim 11, wherein the plurality of fields further includes a cyclic redundancy check (CRC) field, a length field that is part of the PHY header field, a signal field, and a service field, the processing circuitry being further configured to determine a value of the length field by at least one of:
- determining whether the CRC value is correct;
- determining whether at least one of the signal field and the service field have errors; and
- determining a number of Barker code correlations.

14. The first WD of claim 11, wherein;
the plurality of fields further includes a cyclic redundancy check (CRC) field, a length field that is part of the PHY header field, the processing circuitry being further configured to, for each received wireless packet:
- determine a number of de-spread bits stored in the first location;
- determine a value of the length field based upon the determined number of de-spread bits; and
- determine a CRC value using the determined value of the length field.

15. The first WD of claim 14, wherein a first total number of bits is determined based in part on one value of at least one field of the plurality of fields and an estimated value of at least another field of the plurality of fields.

16. The first WD of claim 11, wherein the plurality of fields further includes a duration field, a retry field, a type field, and a subtype field, the processing circuitry being further configured to:
- set a value of the duration field to a predetermined duration field value;
- set a value of the retry field to 0 for a first received wireless packet and the value of the retry field to 1 for a second received wireless packet; and
- set each of a value of the type field to a predetermined type field value and a value of the subtype field to a predetermined subtype field value.

17. The first WD of claim 10, wherein, when a number of received packets is an odd number, greater than 1, creating the corrected packet includes:
- assembling a new plurality of scrambled bits based at least in part on the whether the number of comparison results exceeding the first threshold is greater than N;
- de-scrambling the new plurality of scrambled bits; and
- creating the corrected packet further from the de-scrambled new plurality of scrambled bits.

18. The first WD of claim 10, wherein the processing circuitry is further configured to:
- determine the corrected packet is error free by performing a frame check sum (FCS); and
- transmit an acknowledgement (ACK) signal to the second WD.

* * * * *